(12) United States Patent
Akiyama

(10) Patent No.: US 11,870,425 B2
(45) Date of Patent: Jan. 9, 2024

(54) GATE DRIVE DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Hironori Akiyama, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 17/860,636

(22) Filed: Jul. 8, 2022

(65) Prior Publication Data

US 2023/0021657 A1    Jan. 26, 2023

(30) Foreign Application Priority Data

Jul. 16, 2021    (JP) ................................. 2021-117905

(51) Int. Cl.
| | |
|---|---|
| *H03K 17/041* | (2006.01) |
| *H03K 17/14* | (2006.01) |
| *H03K 17/06* | (2006.01) |
| *H03K 17/28* | (2006.01) |

(52) U.S. Cl.
CPC . *H03K 17/04113* (2013.01); *H03K 17/04106* (2013.01); *H03K 17/063* (2013.01); *H03K 17/145* (2013.01); *H03K 17/28* (2013.01)

(58) Field of Classification Search
CPC .... H03K 17/16; H03K 17/165; H03K 17/166; H03K 17/167; H03K 17/168; H03K 17/161; H03K 17/51; H03K 17/56; H03K 17/687; H03K 17/6871; H03K 17/6872; H03K 17/6874; H03K 17/6877; H03K 2017/6875; H03K 17/00; H03K 17/08;
(Continued)

(56) References Cited

U.S. PATENT DOCUMENTS

| | | | | |
|---|---|---|---|---|
| 9,614,517 B2* | 4/2017 | Krishna | ................ | H03K 17/165 |
| 11,005,472 B2* | 5/2021 | Illing | .................. | H03K 17/0822 |
| 11,435,770 B2* | 9/2022 | Strydom | ................. | G05F 1/565 |

(Continued)

FOREIGN PATENT DOCUMENTS

JP     2020-113867 A     7/2020

*Primary Examiner* — Diana J. Cheng
(74) *Attorney, Agent, or Firm* — POSZ LAW GROUP, PLC

(57) ABSTRACT

A change rate control circuit computes a first drive speed, which is a gate drive speed of a gate of a drive-subject element, for controlling a change rate of an element voltage of the drive-subject element at a target change rate during a change period. A timing generating circuit acquires, in advance, a delay time caused when the gate is driven and determines a switching timing, at which the element voltage reaches a switching threshold voltage which is lower than a desired switching voltage by a predetermined value, during turn-off of the drive-subject element and generates a timing signal representing the switching timing. A speed change circuit changes the gate drive speed from the first drive speed to a second drive speed at the switching timing during turn-off of the drive-subject element.

17 Claims, 23 Drawing Sheets

(58) Field of Classification Search
CPC ............. H03K 17/082; H03K 17/0822; H03K 17/0824; H03K 17/0826; H03K 17/0828
See application file for complete search history.

(56) References Cited

U.S. PATENT DOCUMENTS

| | | |
|---|---|---|
| 2017/0288597 A1 | 10/2017 | Ojima et al. |
| 2020/0021282 A1 | 1/2020 | Yamamoto et al. |
| 2021/0036697 A1 | 2/2021 | Yamamoto et al. |
| 2021/0258004 A1 | 8/2021 | Akiyama et al. |
| 2022/0407511 A1 | 12/2022 | Akiyama et al. |
| 2022/0413535 A1* | 12/2022 | Strydom ................. G05F 1/577 |
| 2022/0416782 A1 | 12/2022 | Akiyama et al. |
| 2023/0114152 A1 | 4/2023 | Akiyama et al. |

* cited by examiner

FIG. 15

| | MONITORING RESULT | | TIMING DETERMINATION | PROCESS |
|---|---|---|---|---|
| Ig1 > Ig2 | SURGE VOLTAGE | dV/dt | | |
| YES | MATCH TARGET | LOWER THAN TARGET | EARLIER THAN TARGET | INCREASE Vt |
| YES | HIGHER THAN TARGET | MATCH TARGET | LATER THAN TARGET | REDUCE Vt |
| YES | MATCH TARGET | MATCH TARGET | MATCH TARGET | Vt NOT CHANGED |
| NO | MATCH TARGET | HIGHER THAN TARGET | EARLIER THAN TARGET | INCREASE Vt |
| NO | LOWER THAN TARGET | MATCH TARGET | LATER THAN TARGET | REDUCE Vt |
| NO | MATCH TARGET | MATCH TARGET | MATCH TARGET | Vt NOT CHANGED |

GATE DRIVE DEVICE

CROSS REFERENCE TO RELATED APPLICATION

The present application claims the benefit of priority from Japanese Patent Application No. 2021-117905 filed on Jul. 16, 2021. The entire disclosures of all of the above applications are incorporated herein by reference.

TECHNICAL FIELD

The present disclosure relates to a gate drive device configured to drive a gate of a drive-subject element which is one of two semiconductor switching elements included in an upper and lower arm of a half bridge circuit.

BACKGROUND

Conventionally, a gate drive device is used to manipulate a gate voltage of a transistor such as an IGBT.

SUMMARY

According to an aspect of the present disclosure, a gate drive device comprises a gate drive circuit configured to drive a gate of a drive-subject element, which is one of two semiconductor switching elements included in an upper and lower arm of a half bridge circuit. The gate drive device further comprises a sensing circuit configured to acquire a physical quantity related to the drive-subject element and sense an element voltage, which is a voltage between main terminals of the drive-subject element, on a basis of the physical quantity. The gate drive device further comprises a change rate control circuit configured to compute, on a basis of a sensing value of the sensing circuit and a target change rate which is a target value of a change rate of the element voltage during a change period in which the element voltage changes, a first drive speed which is a gate drive speed of the drive-subject element for controlling the change rate of the element voltage during the change period, such that the change rate becomes the target change rate.

BRIEF DESCRIPTION OF THE DRAWINGS

The above and other objects, features and advantages of the present disclosure will become more apparent from the following detailed description made with reference to the accompanying drawings. In the drawings:

FIG. 15 is a figure depicting a specific example of adjustment operation by a timing correcting circuit according to the fourth embodiment.

DETAILED DESCRIPTION

Figure 1:
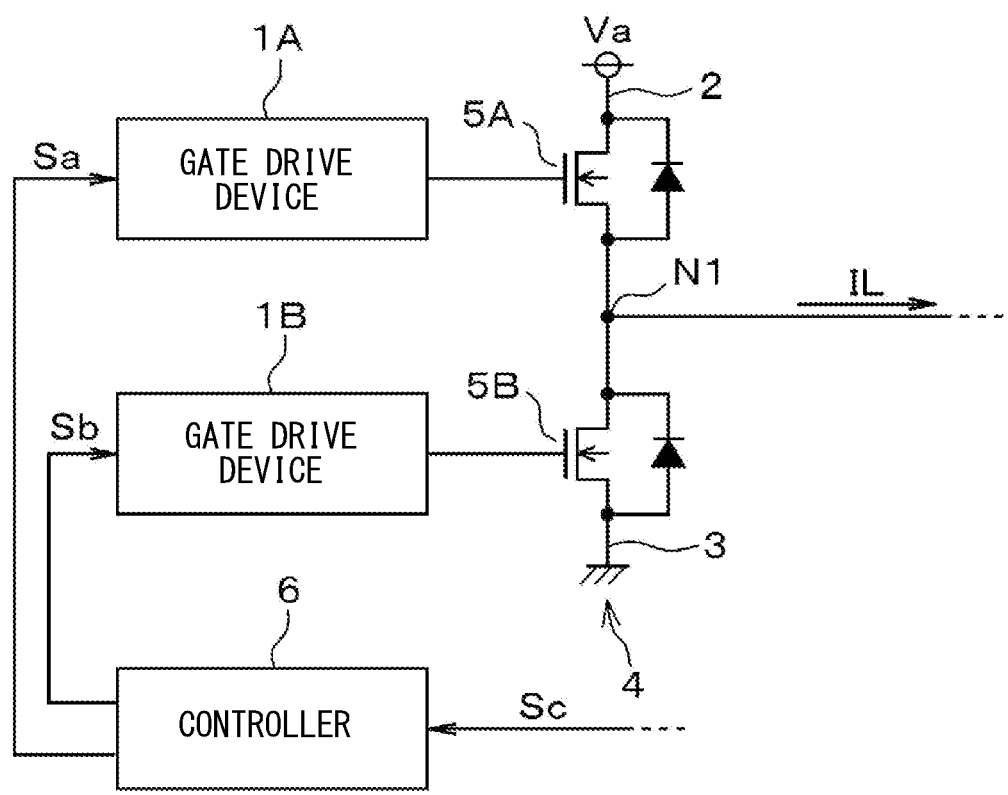
FIG. 1 is a figure schematically depicting the schematic configuration of gate drive devices, and a half bridge circuit according to a first embodiment.

Hereinafter, examples of the present disclosure will be described.

According to an example of the present disclosure, a gate drive device is configured to monitor a collector voltage of an IGBT, which is a drive-subject semiconductor switching element, in a turn-off period of the IGBT. The gate drive device is further configured to perform switching at a relatively high speed during a period until the collector voltage exceeds an assessment threshold decided in advance. The gate drive device is configured to thereafter perform switching at a relatively low speed in the subsequent period, thereby suppressing increase of switching loss at time of turn-off of the semiconductor switching element while reducing a surge voltage to be applied to the main terminal of the semiconductor switching element. In this manner, the gate drive devise attempts to pursue both protection of a semiconductor switching element, and loss reduction in the semiconductor switching element.

In this gate drive device, there may be a risk of the occurrence of issues like the ones mentioned below. In this configuration, due to an influence of delay time from sensing of the collector voltage exceeding the assessment threshold until a time point at which the switching speed is actually changed, there is a possibility that the switching timing of the switching speed becomes a timing different from a desired timing. If the switching timing of the switching speed becomes different from the desired timing, there are risks that the switching loss increases, the surge voltage exceeds a tolerance, and so on.

Specifically, assuming in this configuration, the earlier than the desired timing the switching timing of the switching speed is, the larger the increase of the switching loss is; in addition, the later than the desired timing the switching timing of the switching speed is, the higher the surge voltage is. Such an issue resulting from the difference of the switching timing becomes more noticeable in a case that the semiconductor switching element is switched at a higher speed. Accordingly, particularly in a case this configuration is applied to a system with a faster switching speed of a semiconductor switching element, undesirably may become difficult to attempt to pursue both protection of the semiconductor switching element, and loss reduction in the semiconductor switching element.

According to an example of the present disclosure, a gate drive device comprises a gate drive circuit configured to drive a gate of a drive-subject element, which is one of two semiconductor switching elements included in an upper and lower arm of a half bridge circuit. The gate drive device further comprises a sensing circuit configured to acquire a physical quantity related to the drive-subject element and sense an element voltage, which is a voltage between main terminals of the drive-subject element, on a basis of the physical quantity. The gate drive device further comprises a change rate control circuit configured to compute, on a basis of a sensing value of the sensing circuit and a target change rate which is a target value of a change rate of the element voltage during a change period in which the element voltage changes, a first drive speed which is a gate drive speed of the drive-subject element for controlling the change rate of the element voltage during the change period, such that the change rate becomes the target change rate.

The gate drive device further comprises a timing generating circuit configured to acquire, in advance, a delay time caused in each circuit when the gate of the drive-subject element is driven, determine, on a basis of the target change rate and the delay time, a switching timing, at which the element voltage reaches a switching threshold voltage which is lower than a desired switching voltage by a predetermined value, during turn-off of the drive-subject element, and generate a timing signal representing the switching timing. The gate drive device further comprises a speed change circuit configured to change the gate drive speed of the drive-subject element from the first drive speed to a second drive speed, which is different from the first drive speed, at the switching timing represented by the timing signal during turn-off of the drive-subject element.

According to such a configuration, because the gate drive speed of the drive-subject element is changed from the first drive speed to the second drive speed during turn-off of the drive-subject element, it becomes possible to reduce a surge voltage while controlling the change rate of the element voltage such that the change rate becomes a desired value. According to the configuration described above, when the gate drive speed is set to the first drive speed during turn-off of the drive-subject element, the change rate of the element voltage is controlled such that the change rate becomes the target change rate. Accordingly, it becomes possible for the timing generating circuit to precisely predict and determine the switching timing at which the element voltage reaches the switching threshold voltage on the basis of the target change rate, and the delay time.

Accordingly, according to the configuration described above, the actual gate drive speed is changed from the first drive speed to the second drive speed at a timing at which the element voltage reaches the desired switching voltage or at a timing close to it. In this manner, according to the configuration described above, the actual gate drive speed is switched at a desired timing, and so it is possible to reduce a surge voltage while controlling the change rate of the element voltage such that the change rate becomes a desired value, that is, to attempt to pursue both protection of the semiconductor switching element, and loss reduction in the semiconductor switching element.

A plurality of embodiments is to be explained below with reference to the figures. Note that substantially identical configurations are given identical reference characters in the embodiments, and explanations thereof are omitted.

First Embodiment

A first embodiment is explained below with reference to FIG. 1 to FIG. 5.

<Schematic Configuration of Gate Drive Device>

As depicted in FIG. 1, a gate drive device 1A according to the present embodiment drives a semiconductor switching element 5A included in the upper arm of a half bridge circuit 4 connected between a pair of DC power supply lines 2, and 3. In addition, a gate drive device 1B according to the present embodiment drives a semiconductor switching element 5B included in the lower arm of the half bridge circuit 4. In this case, the gate drive devices 1A, and 1B have similar configurations, and the semiconductor switching elements 5A, and 5B have similar configurations. Accordingly, in the present specification, in a case that it is not necessary to make a distinction between the gate drive devices 1A, and 1B, and between the semiconductor switching elements 5A, and 5B, the gate drive devices 1A, and 1B, and the semiconductor switching elements 5A, and 5B are, respectively, denoted collectively by omitting alphabetical characters at the ends.

The half bridge circuit 4 is included in an inverter that drives a motor which is not depicted in the figure. The half bridge circuit 4 is supplied with a power supply voltage Va from a DC power supply which is not depicted in the figure such as a battery, for example, via the DC power supply lines 2, and 3. The semiconductor switching element 5 is a power device, and, in this case, has a configuration including an N-channel MOSFET, and a freewheeling diode whose source side is connected as an anode between the drain, and source of the MOSFET, that is, which is connected anti-parallel to the MOSFET. Note that whereas the freewheeling diode is provided as an element separate from the MOSFET in this case, a body diode of the MOSFET may be used as a freewheeling diode.

The drain of the semiconductor switching element 5A is connected to the DC power supply line 2 on the high-potential side. The source of the semiconductor switching element 5A is connected to the drain of the semiconductor switching element 5B. The source of the semiconductor switching element 5B is connected to the DC power supply line 3 on the low-potential side. A node N1 which is the interconnection node between the semiconductor switching element 5A and the semiconductor switching element 5B is connected to a motor which is described above, but is not depicted in the figure. Thereby, a load current IL which is the output current of the half bridge circuit 4 is supplied to the motor. For example, a controller 6 has a configuration including a microcomputer, and the like, and controls driving of the motor by controlling operation of the half bridge circuit 4 included in the inverter.

The controller 6 is given a sensing signal Sc representing a sensing value of the load current IL output from a current sensing section which is not depicted in the figure. On the basis of the sensing signal Sc, the controller 6 generates and outputs a command signal Sa which is a command for operation of the gate drive device 1A, and a command signal Sb which is a command for the gate drive device 1B such that the load current IL matches a desired target current. On the basis of the command signal Sa given from the controller 6, the gate drive device 1A performs PWM control of driving of the semiconductor switching element 5A. Note that PWM is an abbreviation of Pulse Width Modulation. In addition, on the basis of the command signal Sb given from the controller 6, the gate drive device 1B performs PWM control of driving of the semiconductor switching element 5B.

In this case, the semiconductor switching element 5A, and the semiconductor switching element 5B are turned on and off complementarily. Accordingly, the semiconductor switching element 5B is turned off during a period in which the semiconductor switching element 5A is turned on, and also the semiconductor switching element 5A is turned off during a period in which the semiconductor switching element 5B is turned on. According to the configuration described above, during a period in which the load current IL flows from the node N1 to the motor, the semiconductor switching element 5A is driven to cause a current to flow in the forward direction from the drain toward the source, and also the semiconductor switching element 5B is driven to cause a current to flow in the reverse direction from the source toward the drain. In addition, according to the configuration described above, during a period in which the load current IL flows from the motor to the node N1, the semiconductor switching element 5B is driven to cause a current to flow in the forward direction from the drain toward the source, and also the semiconductor switching element 5A is driven to cause a current to flow in the reverse direction from the source toward the drain.

In the configuration described above, a drain-source voltage Vds of the semiconductor switching element 5 is a voltage between main terminals of the semiconductor switching element 5, and is equivalent to an element voltage. In addition, in the configuration described above, a drain current Id is a current that flows between the main terminals of the semiconductor switching element 5, and is equivalent to an element current. Note that, in the present specification, the drain current Id, the drain-source voltage Vds, and a gate-source voltage Vgs of the semiconductor switching element 5 are simply referred to as the current Id, the voltage Vds, and the voltage Vgs, respectively, in some cases.

Figure 2:
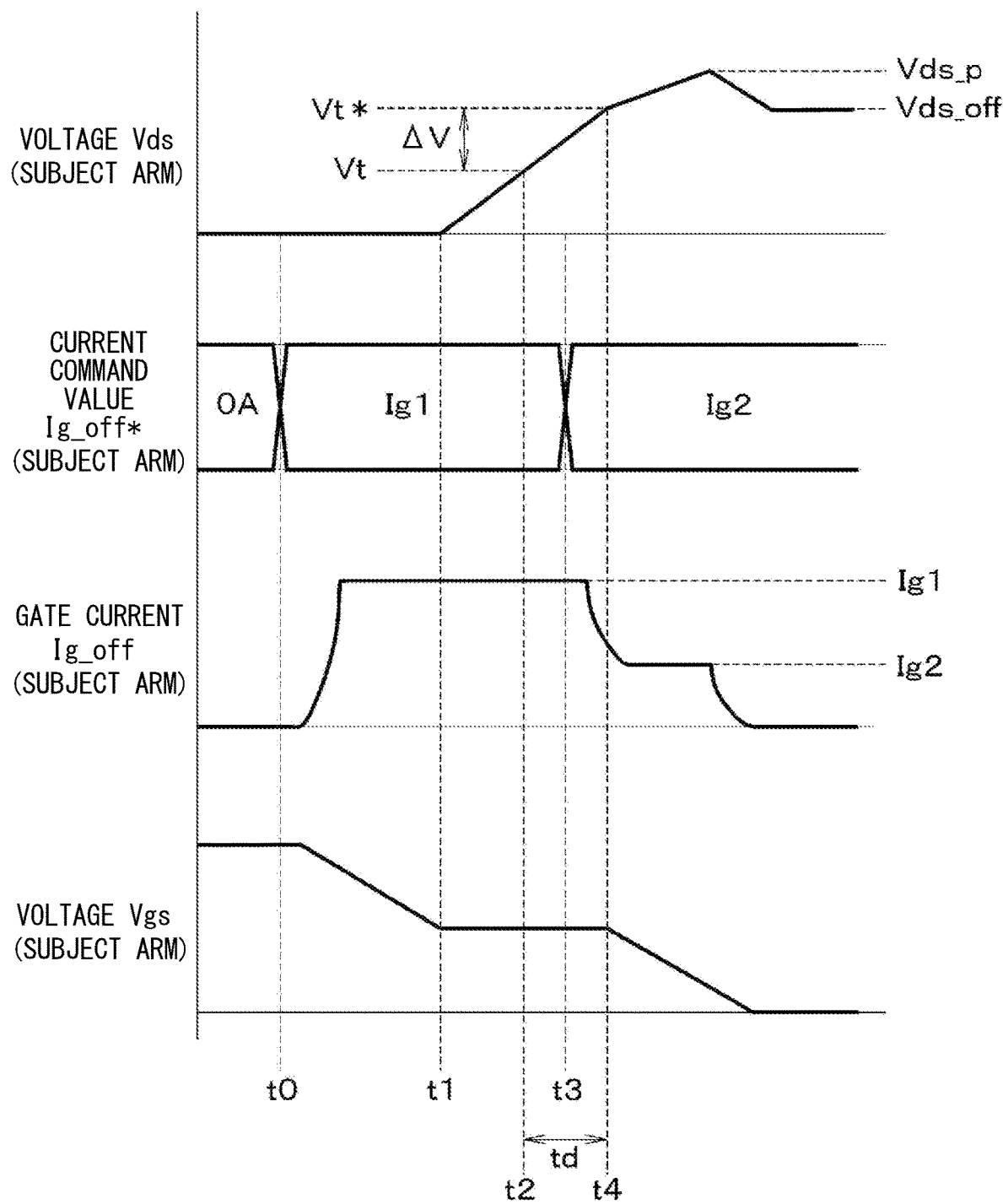
FIG. 2 is a timing chart schematically depicting an operation waveform of each section of a gate drive device at time of turn-off of a semiconductor switching element according to the first embodiment.

Waveforms of sections of the semiconductor switching element 5 at time of turn-off are waveforms like the ones depicted in FIG. 2. Note that whereas waveforms of sections corresponding to the semiconductor switching element 5B are illustrated in FIG. 2, waveforms of the semiconductor switching element 5A are also similar waveforms. An OFF voltage Vds_off generated when the semiconductor switching element 5B is turned off is a voltage approximately equal to the power supply voltage Va. In this case, the differential voltage between the peak voltage which is a peak value Vds_p of the voltage Vds at time of turn-off and the OFF voltage Vds_off is equivalent to a surge voltage to be superimposed on the semiconductor switching element 5B. In this case, the inclination of a change of the voltage Vds is equivalent to the change rate of the element voltage during a change period in which the element voltage changes. Note that, in the present specification, the inclination of the change of the voltage Vds is referred to as a change rate dV/dt in some cases.

<Main Functionalities of Gate Drive Device>

Figure 3:
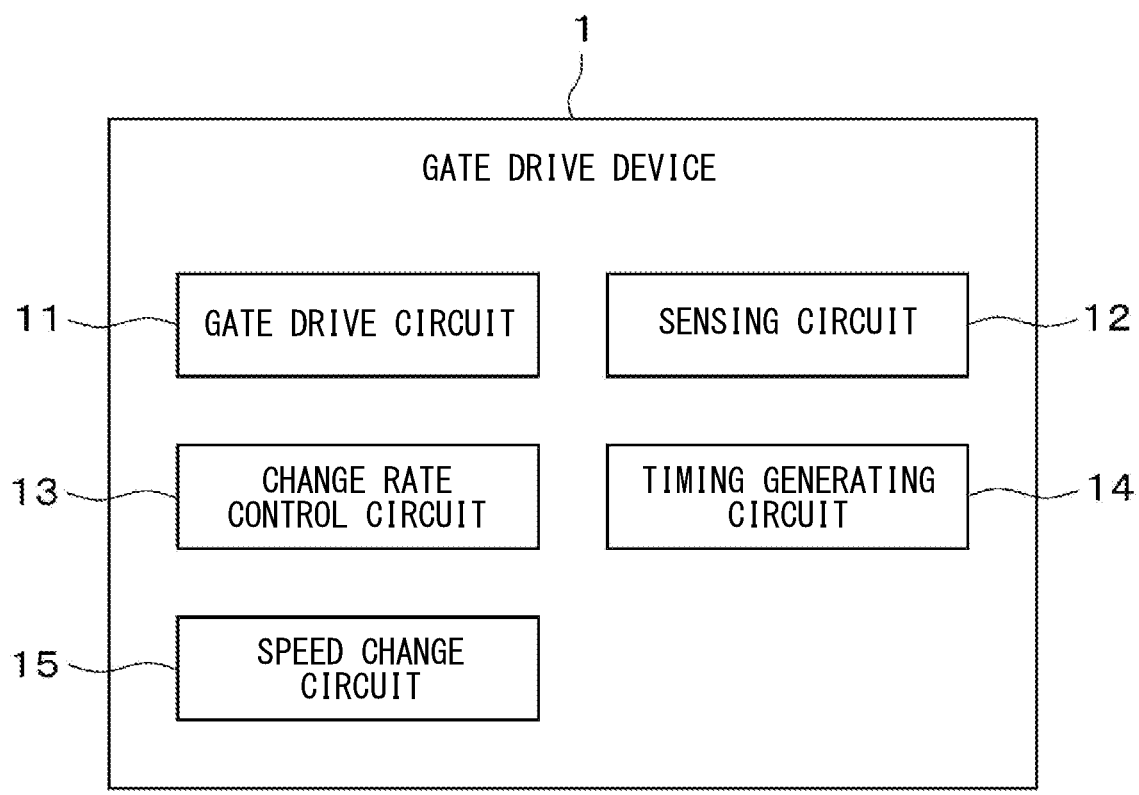
FIG. 3 is a figure schematically depicting main functionalities of the gate drive device according to the first embodiment.

Next, main functionalities of the gate drive device 1 are explained with reference to FIG. 3. In FIG. 3, and the like, main functionalities of the gate drive device 1 are represented in the form of functional blocks. A specific realization method of each functionality is mentioned later. In the explanation below, a subject of driving of a subject device in the two semiconductor switching elements 5 is referred to as a subject-arm semiconductor switching element 5, and also a subject of driving of a gate drive device 1 different from the subject device is referred to as an opposite-arm semiconductor switching element 5.

The subject-arm semiconductor switching element 5 corresponds to a drive-subject element which is one of two semiconductor switching elements in claims, and the opposite-arm semiconductor switching element 5 corresponds to a non-drive-subject element which is the other of the two semiconductor switching elements in claims. Note that in a case that a semiconductor switching element 5 is simply referred to as a semiconductor switching element 5, the semiconductor switching element 5 represents the subject-arm semiconductor switching element 5.

A gate drive circuit 11 drives the gate of a drive-subject element which is one of the two semiconductor switching elements 5A, and 5B, that is, the subject-arm semiconductor switching element 5, included in the upper and lower arm of the half bridge circuit 4. A sensing circuit 12 acquires a physical quantity related to the subject-arm semiconductor switching element 5, that is, the semiconductor switching element 5 which is a subject of driving of the gate drive device 1, and, on the basis of the physical quantity, senses the voltage Vds of the subject-arm semiconductor switching element 5. Examples of the physical quantity described above include, for example, the voltage Vds, the voltage Vgs, the current Id, a junction temperature Tj, and the like. Note that in a case that at least one of the voltage Vgs, the current Id, and the junction temperature Tj is acquired as the physical quantity described above, the sensing circuit 12 estimates the voltage Vds on the basis of the physical quantity.

A change rate control circuit 13 controls the change rate dV/dt during a change period in which the voltage Vds changes such that the change rate dV/dt becomes a target change rate dV/dt* which is the target value of the change rate dV/dt. Note that, in the present specification, the change rate dV/dt is referred to as an inclination dV/dt in some cases, and also the target change rate dV/dt* is referred to as a target value dV/dt* in some cases. Specifically, on the basis of a sensing value of the sensing circuit 12, and the target value dV/dt*, the change rate control circuit 13 computes a first drive speed for controlling the change rate dV/dt of the voltage Vds during a change period such that the change rate dV/dt becomes the target value dV/dt*. The first drive speed is a gate drive speed of the subject-arm semiconductor switching element 5 for controlling the change rate dV/dt during a change period such that the change rate dV/dt becomes the target value dV/dt*.

A timing generating circuit 14 acquires, in advance, delay time td that occurs in each circuit when the gate of the subject-arm semiconductor switching element 5 is driven. On the basis of the target change rate dV/dt*, and the delay time td, the timing generating circuit 14 determines a switching timing, and generates a timing signal representing the switching timing. The switching timing is a timing at which the voltage Vds reaches a switching threshold voltage Vt which is lower than a desired switching voltage Vt* by a predetermined value during turn-off of the subject-arm semiconductor switching element 5.

The switching voltage Vt* is set to such a voltage that the voltage value of a surge voltage applied to the main terminals of the subject-arm semiconductor switching element 5 becomes equal to or lower than a predetermined tolerance. Note that the tolerance described above is set in accordance with the specifications of the semiconductor switching element 5, and specifically is a value like the one mentioned below. That is, the tolerance is a value which is lower than the withstand voltage of the semiconductor switching element 5 by an amount corresponding to a predetermined margin, and is set to such a value that whereas there is not a possibility that the semiconductor switching element 5 malfunctions even if a voltage with the value is applied to the main terminals, there is a possibility the semiconductor switching element 5 malfunctions if a voltage which exceeds the value by the margin described above or more is applied to the main terminals.

The timing generating circuit 14 is configured to determine, as the switching timing, a timing at which the switching threshold voltage Vt satisfying Formula (1) described below is reached.

$$Vt = Vt^* - dV/dt^* \times td \quad (1)$$

A speed change circuit 15 changes the gate drive speed of the semiconductor switching element 5 from the first drive speed to a second drive speed which is different from the first drive speed at the switching timing represented by the timing signal generated by the timing generating circuit 14 during turn-off of the subject-arm semiconductor switching element 5. The second drive speed is set to such a speed that the voltage value of the surge voltage applied to the main terminals of the subject-arm semiconductor switching element 5 becomes equal to or lower than the tolerance described above. Note that the gate drive speed of the semiconductor switching element 5 is correlated with a gate current which is a current to flow through the gate. In view of this, in this case, the change rate control circuit 13 is configured to compute a first current value Ig1 which is the current value of a gate current Ig_off corresponding to the first drive speed.

The gate current Ig_off described above is a gate current to turn off the gate of the semiconductor switching element 5. In addition, in this case, the speed change circuit 15 is configured to change the gate drive speed of the semiconductor switching element 5 from the first drive speed to the second drive speed by switching the gate current Ig_off from the first current value Ig1 corresponding to the first drive speed to a second current value Ig2 corresponding to the second drive speed at the switching timing during turn-off of the semiconductor switching element 5.

In this case, the change rate control circuit 13 is configured to output a change permission signal when it is sensed that the difference between the change rate dV/dt and the target value dV/dt* is stabilized at a value which is smaller than a preset error tolerance. Then, the speed change circuit 15 is configured to switch the gate current Ig_off, that is, change the gate drive speed, only during a period in which the change permission signal is being output from the change rate control circuit 13.

<Specific Configuration of Gate Drive Device>

Figure 4:
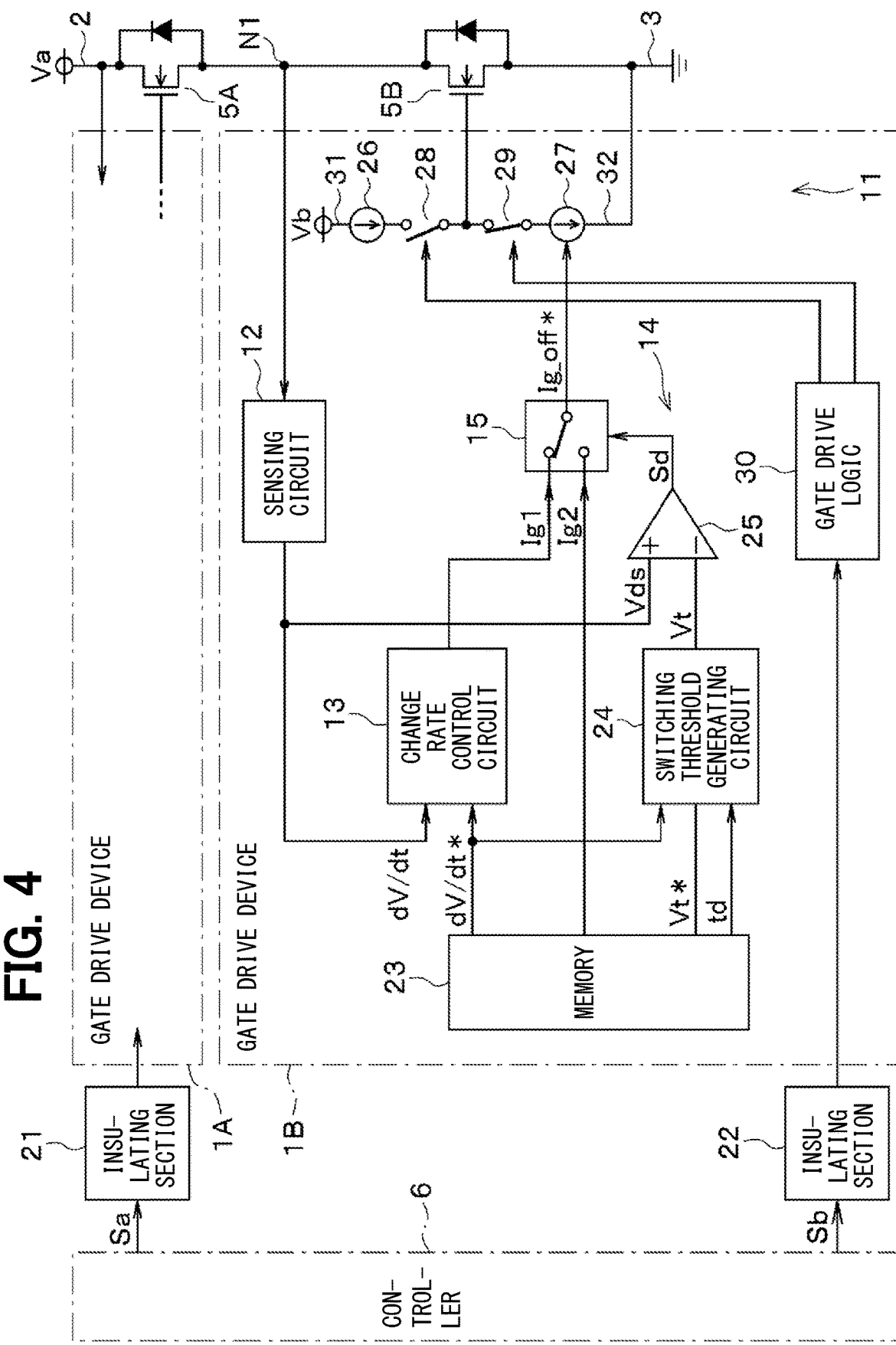
FIG. 4 is a figure depicting an example of the specific configuration of the gate drive device according to the first embodiment.

As the specific configuration of the gate drive device 1 having functionalities like the ones described above, a configuration example like the one depicted in FIG. 4 can be adopted, for example. It is supposed in this case that the gate drive device 1 is used as a vehicle-mounted gate drive device mounted on a vehicle such as an automobile, for example, and the power supply voltage Va applied to the semiconductor switching element 5 is a relatively high voltage in the order of several hundred volts, for example. Accordingly, in this case, the controller 6, and the gate drive devices 1A, and 1B are insulated via insulating sections 21, and 22 including magnetic couplers or the like.

That is, in this case, the command signals Sa, and Sb output from the controller 6 are given to the gate drive devices 1A, and 1B via the insulating sections 21, and 22. Note that whereas the specific configuration of the gate drive device 1 is depicted in FIG. 4 by using the gate drive device 1B as an example, a similar configuration can be adopted for the gate drive device 1A also. The gate drive device 1 depicted in FIG. 6 includes the gate drive circuit 11, the sensing circuit 12, the change rate control circuit 13, the timing generating circuit 14, the speed change circuit 15, a memory 23, and the like.

The memory 23 has stored thereon in advance the target change rate dV/dt*, the second current value Ig2, the switching voltage Vt*, the delay time td, and the like. The values stored on the memory 23 can be acquired in advance by performing various types of simulation, and so on, for example. The memory 23 outputs a signal representing the target change rate dV/dt*, a signal representing the second current value Ig2, a signal representing the switching voltage Vt*, and a signal representing the delay time td. Note that, in FIG. 4, and the like, the signals are depicted by being given reference characters which are the same as values or the like represented by the signals.

The sensing circuit 12 receives, as input, the voltage of the node N1, that is, the drain voltage of the semiconductor switching element 5B. The sensing circuit 12 is configured as a circuit that receives, as input, the drain voltage of the semiconductor switching element 5B, that is, the voltage Vds, in a case that the potential of the source of the semiconductor switching element 5B is used as a reference potential, and monitors the waveform of the voltage Vds. By monitoring the voltage-Vds waveform, the sensing circuit 12 senses the change rate dV/dt of the voltage Vds, and the voltage value of the voltage Vds. The sensing circuit 12 outputs a signal representing a sensing value of the change rate dV/dt, and a voltage corresponding to the voltage value of the voltage Vds. Note that, in FIG. 4, and the like, such a voltage corresponding to the voltage value of the voltage Vds is referred to as the voltage Vds.

The change rate control circuit 13 receives, as input, a signal dV/dt, and a signal dV/dt*. On the basis of the input signals, the change rate control circuit 13 computes such a first current value Ig1 corresponding to the first drive speed that the change rate dV/dt of the voltage Vds at time of turn-off becomes equal to the target value dV/dt*. The change rate control circuit 13 outputs a signal representing the first current value Ig1. The timing generating circuit 14 includes a switching threshold generating circuit 24, and a comparator 25. The switching threshold generating circuit 24 receives, as input, the signal dV/dt*, a signal Vt*, and a signal td.

On the basis of the input signals, the switching threshold generating circuit 24 estimates a change amount ΔV of the voltage Vds during switching of the gate current Ig_off. As depicted in FIG. 2, specifically, the change amount ΔV is equivalent to an amount of change of the voltage Vds during the delay time td from time point t2 when the sensing circuit 12 has sensed that the voltage Vds has reached the switching threshold voltage Vt until time point t4 when the gate current Ig_off is actually switched, and is represented by Formula (2) described below.

$$\Delta V = dV/dt \times td \qquad (2)$$

The switching threshold generating circuit 24 generates and outputs, as the switching threshold voltage Vt, a voltage which is lower than the desired switching voltage Vt* by the estimated change amount ΔV. The switching threshold voltage Vt is represented by Formula (3) described below.

$$Vt = Vt^* - \Delta V \qquad (3)$$

The non-inverted input terminal of the comparator 25 receives the voltage Vds as input, and the inverted input terminal of the comparator 25 receives, as input, the switching threshold voltage Vt output from the switching threshold generating circuit 24. Thereby, a signal Sd output from the comparator 25 is a binary signal that is inverted when the voltage Vds reaches the switching threshold voltage Vt, and functions as the timing signal mentioned before.

The speed change circuit 15 includes a switch that selects and outputs either one of signals input to the two input terminals. One input terminal of the speed change circuit 15 receives, as input, the signal Ig1 output from the change rate control circuit 13, and the other input terminal receives, as input, the signal Ig2 output from the memory 23. On the basis of the level of the timing signal Sd output from the comparator 25, the speed change circuit 15 outputs, from its output terminal, either one of the signal Ig1, and the signal Ig2.

Specifically, the speed change circuit 15 outputs the signal Ig1 when the timing signal Sd is at the low level, and also outputs the signal Ig2 when the timing signal Sd is at the high level. The signal output from the speed change circuit 15 functions as a signal representing a current command value Ig_off* which is a command for the current value of the gate current Ig_off to turn off the gate of the semiconductor switching element 5.

The gate drive circuit 11 is configure to perform constant current driving of the gate of the semiconductor switching element 5. That is, the gate drive circuit 11 includes current sources 26, and 27, switches 28, and 29, and a gate drive logic 30. The upstream terminal of the current source 26 is connected to a power supply line 31 supplied with a power supply voltage Vb, and the downstream terminal of the current source 26 is connected to the gate of the semiconductor switching element 5 via the switch 28. The power supply voltage Vb is a voltage relative to the potential, as a reference potential, of a power supply line 32 connected to the source of the semiconductor switching element 5, and is a voltage sufficiently higher than the gate threshold voltage of the semiconductor switching element 5.

The current source 26 is a constant current circuit that generates a constant current to be supplied to the gate of the semiconductor switching element 5 at time of turn-on, that is, a gate current Ig_on for turning on the gate of the semiconductor switching element 5. Note that as a configuration on the turn-on side in the gate drive circuit 11, a resistor having a constant resistance value may be provided instead of the current source 26. That is, the turn-on side of the gate drive circuit 11 may not be a configuration that performs constant current drive. For example, the switch 28 is a configuration including a semiconductor switching element such as a P-channel MOS transistor, and opens and closes connection between the current source 26 and the gate of the semiconductor switching element 5.

The downstream terminal of the current source 27 is connected to the power supply line 32, and the upstream terminal of the current source 27 is connected to the gate of the semiconductor switching element 5 via the switch 29. The current source 27 is a constant current circuit that generates a constant current to be extracted from the gate of the semiconductor switching element 5 at time of turn-off, that is, the gate current Ig_off for turning off the gate of the semiconductor switching element 5. In this case, the current source 27 is configured to be able to change the current value on the basis of the signal Ig_off* output from the speed change circuit 15. For example, the switch 29 is a configuration including a semiconductor switching element such as an N-channel MOS transistor, and opens and closes connection between the gate of the semiconductor switching element 5 and the current source 27.

On the basis of the command signal Sb, the gate drive logic 30 turns on and off the switches 28, and 29 complementarily. It should be noted that, in this case, a period in which both of the switches 28, and 29 are turned off, so-called dead time, is provided. According to the configuration described above, by the switch 28 being turned on, the semiconductor switching element 5 is turned on, and also, by the switch 29 being turned on, the semiconductor switching element 5 is turned off. In addition, according to the configuration described above, by the current value of the current source 27, that is, the gate current Ig_off of the semiconductor switching element 5 at time of turn-off, being changed from the first current value Ig1 to the second current value Ig2 in accordance with the signal Ig_off*, the gate drive speed is changed at a timing at which the voltage Vds has reached a desired value during turn-off.

<Overview of Processes of Each Functionality>

Figure 5:
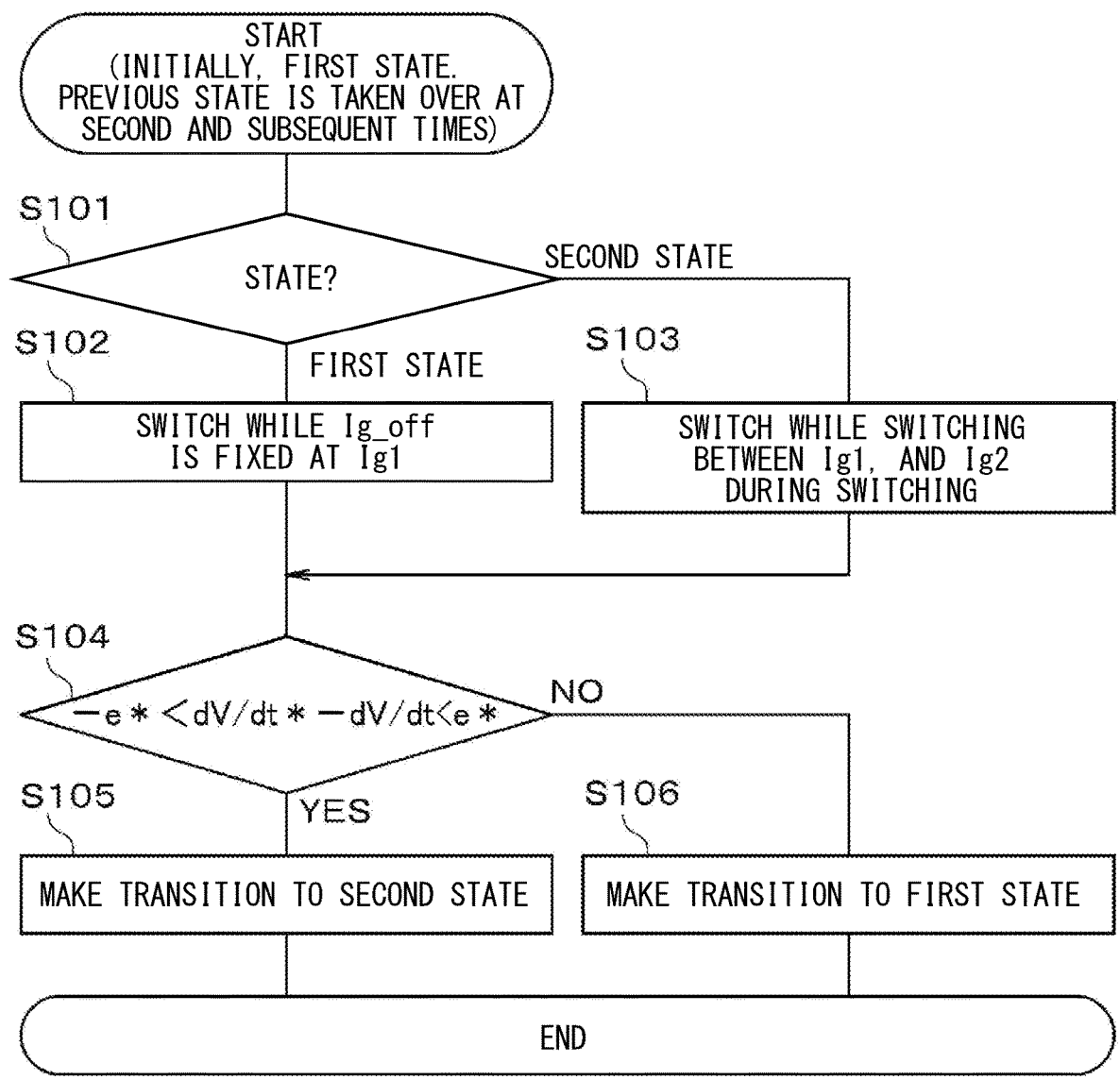
FIG. 5 is a figure schematically depicting the operation flow of the gate drive device according to the first embodiment.

Next, the flow of operation by the gate drive device 1 having the configuration described above is explained with reference to FIG. 5. In the gate drive device 1, a process with contents like the ones depicted in the flowchart of FIG. 5 is executed repeatedly for each instance of switching of the subject-arm semiconductor switching element 5. In the present process, the gate drive device 1 makes a transition to either a first state or a second state mentioned later. Note that the gate drive device 1 is configured to make a transition to the first state at time of first switching at the starting time point of the present process, and takes over the state after a transition in the previous process at time of second and subsequent switching.

As depicted in FIG. 5, at Step S101 executed first after the start of the process, the state of the gate drive device 1 is determined. In a case that the state of the gate drive device 1 is the first state, the process proceeds to Step S102, and in a case that the state of the gate drive device 1 is the second state, the process proceeds to Step S103. At Step S102, switching is performed while the gate current Ig_off is fixed at the first current value Ig1. On the other hand, at Step S103, switching is performed while the gate current Ig_off is switched from the first current value Ig1 to the second current value Ig2 during the switching. After the execution of Step S102 or S103, the process proceeds to Step S104.

At Step S104, it is determined whether or not the difference between the change rate dV/dt and the target value dV/dt* is stabilized at a value smaller than an error tolerance e*. Specifically, it is determined whether or not the difference described above satisfies Formula (4) described below.

$$-e^* < dV/dt^* - dV/dt < e^* \quad (4)$$

In a case that the difference described above satisfies Formula (4), that is, in a case that the difference described above is stabilized at a value smaller than the error tolerance e*, the result of the determination at Step S104 is "YES," and the process proceeds to Step S105. At Step S105, the state of the gate drive device 1 makes a transition to the second state. On the other hand, in a case that the difference described above does not satisfy Formula (4), that is, in a case that the difference described above is equal to or greater than the error tolerance e*, the result of the determination at Step S104 is "NO," and the process proceeds to Step S106. At Step S106, the state of the gate drive device 1 makes a transition to the first state. After the execution of Step S105 or S106, the present process ends.

In this manner, at time of activation of the device, the gate drive device 1 stops switching of the gate current Ig_off, and drives the gate of the semiconductor switching element 5 in a state that the gate current Ig_off is fixed at the first current value Ig1 computed by the change rate control circuit 13. Thereafter, when the difference between the change rate dV/dt and the target value dV/dt* is stabilized at a value smaller than the error tolerance e*, the gate drive device 1 starts performing switching of the gate current Ig_off. After starting performing switching of the gate current Ig_off in this manner, the gate drive device 1 stops switching of the gate current Ig_off when the difference described above has become equal to or greater than the error tolerance e*, and drives the gate of the semiconductor switching element 5 in a state that the gate current Ig_off is fixed at the first current value Ig1. Thereafter, when the difference described above is stabilized at a value smaller than the error tolerance e*, the gate drive device 1 resumes switching of the gate current Ig_off.

<Operation Timing of Each Section at Time of Turn-Off>

Next, an operation timing of each section of the gate drive device 1 at time of turn-off of the semiconductor switching element 5 is explained with reference to FIG. 2. Note that all of the voltage Vds, the current command value Ig_off*, the gate current Ig_off, and the voltage Vgs in FIG. 2 are those of the subject-arm semiconductor switching element 5. Before time point t0 which is a switching start timing at which switching of the subject-arm semiconductor switching element 5 is started, the current command value Ig_off* is a value representing 0 A, and thereby the gate current Ig_off is 0 A.

At time point t0, the current command value Ig_off* becomes the first current value Ig1. Thereby, after the passage of predetermined delay time from time point t0, the gate current Ig_off increases from 0 A to the first current value Ig1, and also the voltage Vgs lowers from a voltage value at time of turn-on to a voltage value at time of turn-off. Thereafter, at time point t1, the voltage Vds of the subject-arm semiconductor switching element 5 starts increasing. The inclination dV/dt of the increase of the voltage Vds generated at this time is controlled such that the inclination dV/dt is the target value dV/dt* by the change rate control circuit 13.

Then, when the voltage Vds reaches the switching threshold voltage Vt at time point t2, the sensing circuit 12 senses that the voltage Vds has reached the switching threshold voltage Vt, and switching of the gate current Ig_off is started. Specifically, at time point t3 after the passage of predetermined delay time that occurs accompanying operation of the sensing circuit 12, the change rate control circuit 13, the timing generating circuit 14, and the speed change circuit 15 after time point t2, the current command value Ig_off* is switched from the first current value Ig1 to the second current value Ig2.

Thereafter, at time point t4 after the passage of predetermined delay time that occurs accompanying operation of the gate drive circuit 11 from time point t3, the actual gate current Ig_off becomes the second current value Ig2, and switching of the gate current Ig_off is completed. Time point t4 is equivalent to an actual switching timing at which switching of the gate current Ig_off is performed. The voltage value of the voltage Vds at such time point t4 is a voltage value approximately equal to the desired switching voltage Vt*. After time point t4, the inclination dV/dt of the voltage Vds becomes gentle as compared to before time point t4, and thereby the voltage value of the surge voltage is reduced to a value equal to or smaller than the tolerance.

According to the gate drive device 1 according to the present embodiment explained above, by the gate current Ig_off of the semiconductor switching element 5 being switched from the first current value Ig1 to the second current value Ig2 during turn-off of the subject-arm semiconductor switching element 5, that is, by the gate drive speed being changed from the first drive speed to the second drive speed, it becomes possible to reduce the surge voltage while controlling the change rate dV/dt of the voltage Vds such that the change rate dV/dt becomes the desired target value dV/dt*. According to the configuration described above, when the gate drive speed is the first drive speed during turn-off of the subject-arm semiconductor switching element 5, the change rate dV/dt of the voltage Vds is controlled such that the change rate dV/dt is the target change rate dV/dt*. Accordingly, it becomes possible for the timing generating circuit 14 to precisely predict and determine the switching timing at which the voltage Vds reaches the switching threshold voltage Vt on the basis of Formula (1) described above using the target change rate dV/dt*, and the delay time td.

Accordingly, according to the configuration described above, by the actual gate current Ig_off being switched at a timing at which the voltage Vds reaches the desired switching voltage Vt* or at a timing close to it, the actual gate drive speed is changed from the first drive speed to the second drive speed. In this manner, according to the present embodiment, the actual gate drive speed is switched at a desired timing, and so it is possible to reduce a surge voltage while controlling the change rate dV/dt of the voltage Vds such that the change rate dV/dt becomes the desired target value dV/dt*, that is, to attempt to pursue both protection of the semiconductor switching element 5, and loss reduction in the semiconductor switching element 5.

The timing generating circuit 14 is configured to determine the switching timing supposing that the change rate dV/dt of the voltage Vds approximately matches the target change rate dV/dt*. Accordingly, if the change rate dV/dt of the voltage Vds has a value significantly different from the target change rate dV/dt*, there is a risk that the precision of estimation of the change amount ΔV by the timing generating circuit 14 lowers, and the switching timing determined by the timing generating circuit 14 is significantly different from a desired timing; as a result, there is a possibility that it becomes impossible for switching of the gate current Ig_off to be performed at the desired switching timing.

In addition, if the switching timing is significantly different from the intended timing, there is a risk that subsequent control of the change rate control circuit 13 also is influenced, and the change rate dV/dt has a value more significantly different from the target change rate dV/dt*. In view of this, in the present embodiment, the change rate control circuit 13 is configured to output the change permission signal if it is sensed that the difference between the change rate dV/dt of the voltage Vds and the target change rate dV/dt* is stabilized at a value smaller than the preset error tolerance e*, and the speed change circuit 15 is configured to perform switching of the gate current Ig_off, and in turn change the gate drive speed, only during a period in which the change permission signal is being output from the change rate control circuit 13.

By adopting this configuration, in a case that the difference between the change rate dV/dt and the target change rate dV/dt* is equal to or higher than the error tolerance e*, switching of the gate current Ig_off is not performed, and the gate current Ig_off is fixed at the first current value Ig1. Accordingly, according to the configuration described above, even in a case that the difference between the change rate dV/dt and the target change rate dV/dt* increases temporarily due to some anomaly, it is possible to avoid an occurrence of a situation where a difference of the switching timing, and a difference of the change rate dV/dt influence each other due to the influence, and thereby the circuit operation fails.

Second Embodiment

Figure 6:
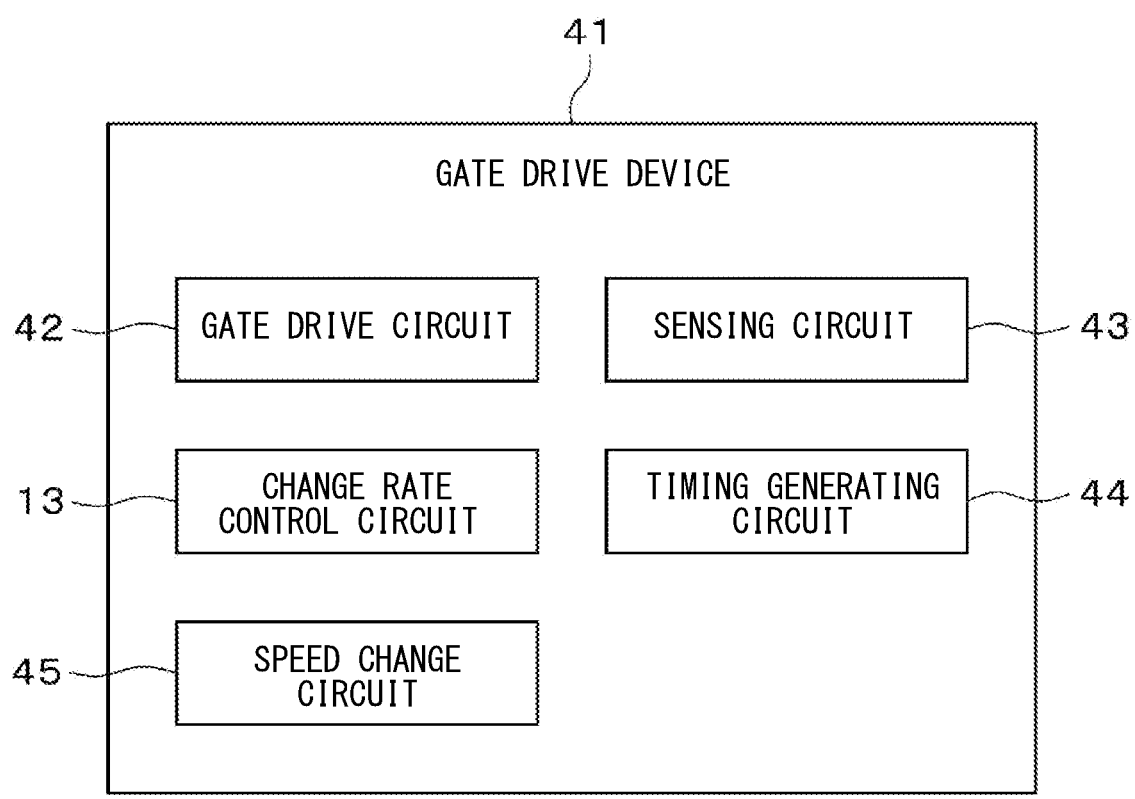
FIG. 6 is a figure schematically depicting main functionalities of a gate drive device according to a second embodiment.

A second embodiment is explained below with reference to FIG. 6 to FIG. 8.

<Main Functionalities of Gate Drive Device>

Main functionalities of a gate drive device 41 according to the present embodiment are explained with reference to FIG. 6. A gate drive circuit 42 has functionalities approximately similar to the functionalities of the gate drive circuit 11 according to the first embodiment. It should be noted that the gate drive circuit 42 drives the gate of a drive-subject element which is one of the two semiconductor switching elements 5A, and 5B, that is, the subject-arm semiconductor switching element 5, included in the upper and lower arm of the half bridge circuit 4.

A sensing circuit 43 has functionalities approximately similar to the functionalities of the sensing circuit 12 according to the first embodiment. It should be noted that the sensing circuit 43 acquires a physical quantity related to the opposite-arm semiconductor switching element 5, and senses the voltage Vds of the opposite-arm semiconductor switching element 5 on the basis of the physical quantity. In this case, on the basis of the sensing value of the sensing circuit 43, and the target value dV/dt*, the change rate control circuit 13 computes the first drive speed for controlling the change rate dV/dt of the voltage Vds during a change period such that the change rate dV/dt becomes the target value dV/dt*.

A timing generating circuit 44 has functionalities approximately similar to the functionalities of the timing generating circuit 14 according to the first embodiment. It should be noted that the switching timing determined by the timing generating circuit 44 is a timing at which the voltage Vds reaches the switching threshold voltage Vt which is lower than the desired switching voltage Vt* by a predetermined value during turn-on of the subject-arm semiconductor switching element 5. A speed change circuit 45 has functionalities approximately similar to the functionalities of the speed change circuit 15 according to the first embodiment. It should be noted that the speed change circuit 45 changes the gate drive speed of the semiconductor switching element 5 from the first drive speed to the second drive speed which is different from the first drive speed at the switching timing represented by the timing signal generated by the timing generating circuit 44 during turn-on of the subject-arm semiconductor switching element 5.

In this case, the change rate control circuit 13 is configured to compute the first current value Ig1 which is the current value of the gate current Ig_on corresponding to the first drive speed. In addition, in this case, the speed change circuit 45 is configured to change the gate drive speed of the semiconductor switching element 5 from the first drive speed to the second drive speed by switching the gate current Ig_on from the first current value Ig1 corresponding to the first drive speed to the second current value Ig2 corresponding to the second drive speed at the switching timing during turn-on of the semiconductor switching element 5. In addition, in this case, the speed change circuit 45 is configured to switch the gate current Ig_on, that is, change the gate drive speed, only during a period in which the change permission signal is being output from the change rate control circuit 13.

<Specific Configuration of Gate Drive Device>

Figure 7:
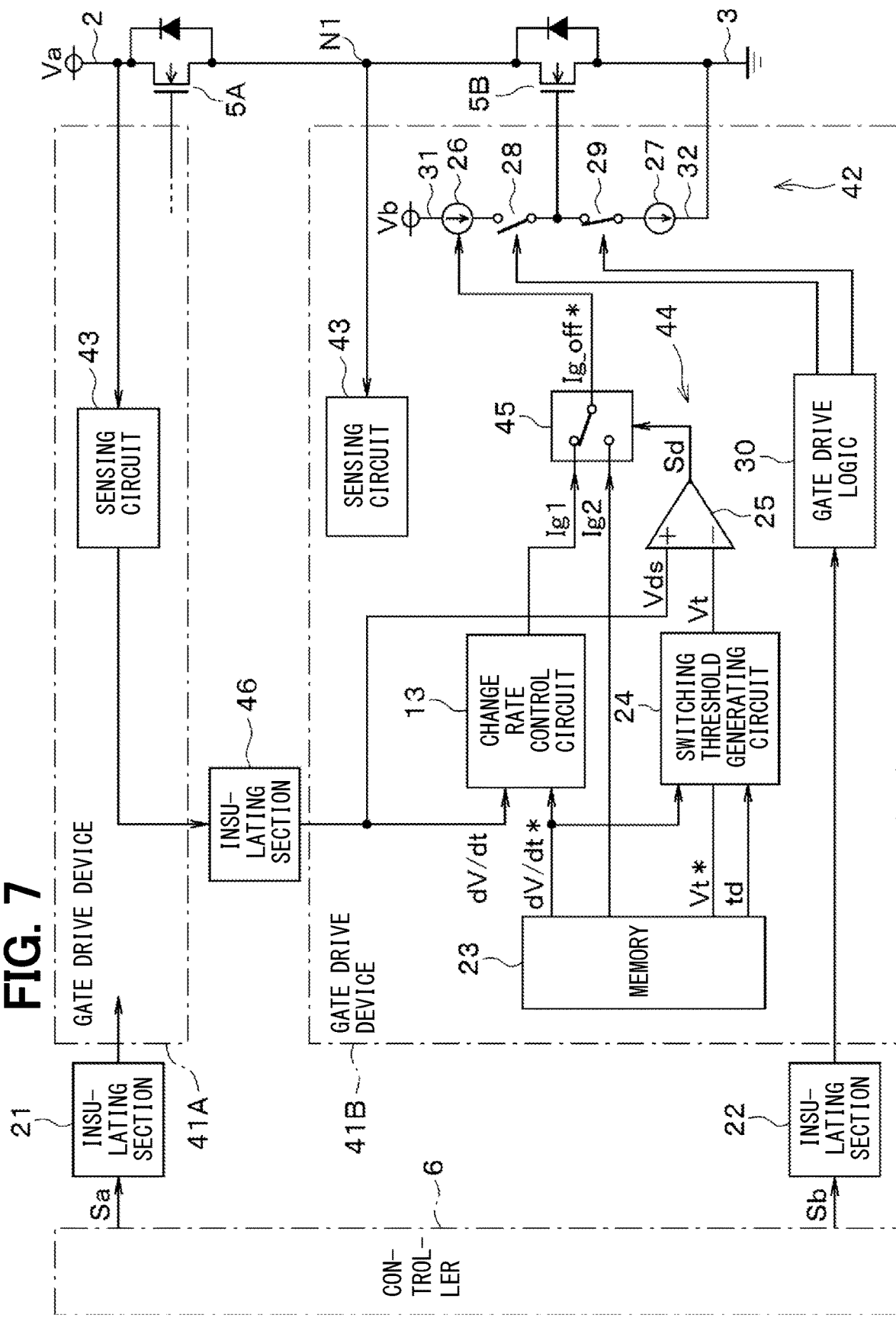
FIG. 7 is a figure depicting an example of the specific configuration of the gate drive device according to the second embodiment.
Figure 8:
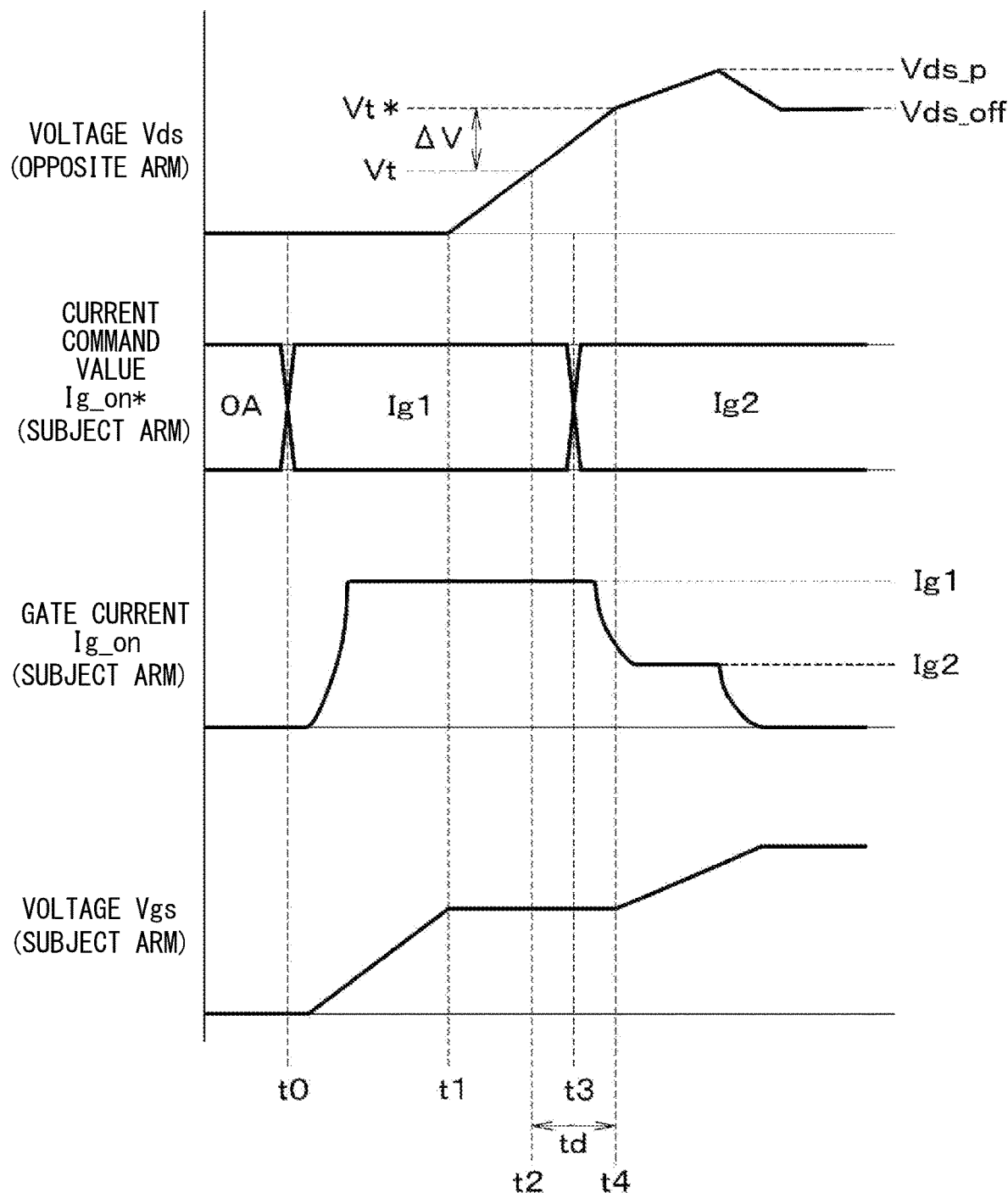
FIG. 8 is a timing chart schematically depicting a waveform of each section at time of turn-on of the semiconductor switching element according to the second embodiment.

As the specific configuration of the gate drive device 41 having functionalities like the ones described above, a configuration example like the one depicted in FIG. 7 can be adopted, for example. The controller 6, and the gate drive devices 41A, and 41B are insulated via insulating sections 21, and 22 including magnetic couplers or the like, similarly to the first embodiment. Note that whereas the specific configuration of the gate drive device 41 is depicted in FIG. 7 by using the gate drive device 41B as an example, a similar configuration can be adopted for the gate drive device 1A also.

The gate drive device 41 depicted in FIG. 7 includes the gate drive circuit 42, the sensing circuit 43, the change rate control circuit 13, the timing generating circuit 44, the speed change circuit 45, the memory 23, and the like. Similarly to the sensing circuit 12 according to the first embodiment, the sensing circuit 43 is configured as a circuit that monitors the waveform of the voltage Vds of the semiconductor switching element 5. In this case, a signal output from the sensing circuit 43 provided in the gate drive device 41 on the opposite-arm side is given to the gate drive device 41 on the subject-arm side via an insulating section 46 including a magnetic coupler or the like, for example.

Note that in a case that application to a low-voltage system in which the power supply voltage Va applied to the semiconductor switching element 5 is a relatively low voltage like 12 V, for example, is expected, in a case that the gate drive device 41 is configured as a circuit that uses a high withstand voltage process, and so on, the insulating section 46 can be omitted. In addition, the configuration in which signals output from the sensing circuits 43 of the gate drive devices 41A, and 41B are directly communicated is not the sole configuration, and the signals are transmitted via the controller 6 in another possible configuration.

In this case, the change rate control circuit 13 receives, as input, the signal dV/dt output from sensing circuit 43 on the opposite-arm side, and the signal dV/dt* output from the memory 23 on the subject-arm side. On the basis of the input signals, the change rate control circuit 13 computes such a first current value Ig1 corresponding to the first drive speed that the change rate dV/dt of the voltage Vds at time of turn-on becomes equal to the target value dV/dt*.

Similarly to the timing generating circuit 14 according to the first embodiment, the timing generating circuit 44 includes the switching threshold generating circuit 24, and the comparator 25. In this case, on the basis of the input signals, the switching threshold generating circuit 24 estimates the change amount ΔV of the voltage Vds during switching of the gate current Ig_on. As depicted in FIG. 8, specifically, the change amount ΔV is equivalent to an amount of change of the voltage Vds during the delay time td from time point t2 when the sensing circuit 43 has sensed that the voltage Vds has reached the switching threshold voltage Vt until time point t4 when the gate current Ig_on is actually switched, and is represented by Formula (2) mentioned before.

The non-inverted input terminal of the comparator 25 receives, as input, the voltage Vds output from the sensing circuit 43 on the opposite-arm side, and the inverted input terminal of the comparator 25 receives, as input, the switching threshold voltage Vt output from the switching threshold generating circuit 24 on the subject-arm side. The speed change circuit 45 includes a switch, similarly to the speed change circuit 15 according to the first embodiment. In this case, the signal output from the speed change circuit 45 functions as a signal representing a current command value Ig_on* which is a command for the current value of the gate current Ig_on to turn on the gate of the semiconductor switching element 5.

Similarly to the gate drive circuit 11 according to the first embodiment, the gate drive circuit 42 is configured to perform constant current drive of the gate of the semiconductor switching element 5, and includes the current sources 26, and 27, the switches 28, and 29, and the gate drive logic 30. It should be noted that, in this case, the current source 26 is configured to be able to change the current value on the basis of the signal Ig_on* output from the speed change circuit 45. Note that as a configuration on the turn-off side in the gate drive circuit 42, a resistor having a constant resistance value may be provided instead of the current source 27. That is, the turn-off side of the gate drive circuit 42 may not be a configuration that performs constant current drive.

According to the configuration described above, by the current value of the current source 26, that is, the gate current Ig_on of the semiconductor switching element 5 at time of turn-on, being changed from the first current value Ig1 to the second current value Ig2 in accordance with the signal Ig_on*, the gate drive speed is changed at a timing at which the voltage Vds has reached a desired value during turn-on.

<Operation Timing of Each Section at Time of Turn-On>

Next, an operation timing of each section of the gate drive device 41 at time of turn-on of the semiconductor switching element 5 is explained with reference to FIG. 8. Note that the voltage Vds in FIG. 8 is that of the opposite-arm semiconductor switching element 5, and all of the current command value Ig_on*, the gate current Ig_on, and the voltage Vgs are those of the subject-arm semiconductor switching element 5. Before time point t0 which is a switching start timing at which switching of the subject-arm semiconductor switching element 5 is started, the current command value Ig_on* is a value representing 0 A, and thereby the gate current Ig_on is 0 A.

At time point t0, the current command value Ig_on* becomes the first current value Ig1. Thereby, after the passage of predetermined delay time from time point t0, the gate current Ig_on increases from 0 A to the first current value Ig1, and also the voltage Vgs increases from the voltage value at time of turn-off to the voltage value at time of turn-on. Thereafter, at time point t1, the voltage Vds of the opposite-arm semiconductor switching element 5 starts increasing. The inclination dV/dt of the increase of the voltage Vds generated at this time is controlled such that the inclination dV/dt is the target value dV/dt* by the change rate control circuit 13.

Then, when the voltage Vds reaches the switching threshold voltage Vt at time point t2, the sensing circuit 43 on the opposite-arm side senses that the voltage Vds has reached the switching threshold voltage Vt, and switching of the gate current Ig_on is started. Specifically, at time point t3 after the passage of predetermined delay time that occurs accompanying operation of the sensing circuit 43, the change rate control circuit 13, the timing generating circuit 44, and the speed change circuit 45 after time point t2, the current command value Ig_on* is switched from the first current value Ig1 to the second current value Ig2.

Thereafter, at time point t4 after the passage of predetermined delay time that occurs accompanying operation of the gate drive circuit 42 from time point t3, the actual gate current Ig_on becomes the second current value Ig2, and switching of the gate current Ig_on is completed. Time point t4 is equivalent to an actual switching timing at which switching of the gate current Ig_on is performed. The voltage value of the voltage Vds at such time point t4 is a voltage value approximately equal to the desired switching voltage Vt*. After time point t4, the inclination dV/dt of the voltage Vds becomes gentle as compared to before time point t4, and thereby the voltage value of the surge voltage is reduced to a value equal to or smaller than the tolerance.

According to the gate drive device 41 according to the present embodiment explained above, by the gate current Ig_on of the semiconductor switching element 5 being switched from the first current value Ig1 to the second current value Ig2 during turn-on of the subject-arm semiconductor switching element 5, that is, by the gate drive speed being changed from the first drive speed to the second drive speed, it becomes possible to reduce the surge voltage applied to the main terminals of the opposite-arm semiconductor switching element 5 while controlling the change rate dV/dt of the voltage Vds of the opposite-arm semiconductor switching element 5 such that the change rate dV/dt becomes the desired target value dV/dt*.

According to the configuration described above, when the gate drive speed is the first drive speed during turn-on of the subject-arm semiconductor switching element 5, the change rate dV/dt of the voltage Vds of the opposite-arm semiconductor switching element 5 is controlled such that the change rate dV/dt is the target change rate dV/dt*. Accordingly, it becomes possible for the timing generating circuit 44 to precisely predict and determine the switching timing at which the voltage Vds of the opposite-arm semiconductor switching element 5 reaches the switching threshold voltage Vt on the basis of Formula (1) described above using the target change rate dV/dt*, and the delay time td.

Accordingly, according to the configuration described above, by the actual gate current Ig_on being switched at a timing at which the voltage Vds of the opposite-arm semiconductor switching element 5 reaches the desired switching voltage Vt* or at a timing close to it, the actual gate drive speed is changed from the first drive speed to the second drive speed. In this manner, according to the present embodiment, the actual gate drive speed is switched at a desired timing, and so it is possible to reduce a surge voltage while controlling the change rate dV/dt of the voltage Vds of the opposite-arm semiconductor switching element 5 such that the change rate dV/dt becomes the desired target value dV/dt*, that is, to attempt to pursue both protection of the semiconductor switching element 5, and loss reduction in the semiconductor switching element 5.

<Specific Configuration of Gate Drive Circuit>

Next, specific configuration examples of the gate drive circuit 11 according to the first embodiment, and the gate drive circuit 42 according to the second embodiment are explained with reference to FIG. 9, and FIG. 10. Note that whereas both the gate current Ig_on, and the gate current Ig_off are changeable in the configurations in the configuration examples, only the gate current Ig_off may be configured to be changeable in a case that a configuration example is used as the gate drive circuit 11 according to the first embodiment, or only the gate current Ig_on may be configured to be changeable in a case that a configuration example is used as the gate drive circuit 42 according to the second embodiment.

[1] First Configuration Example

Figure 9:
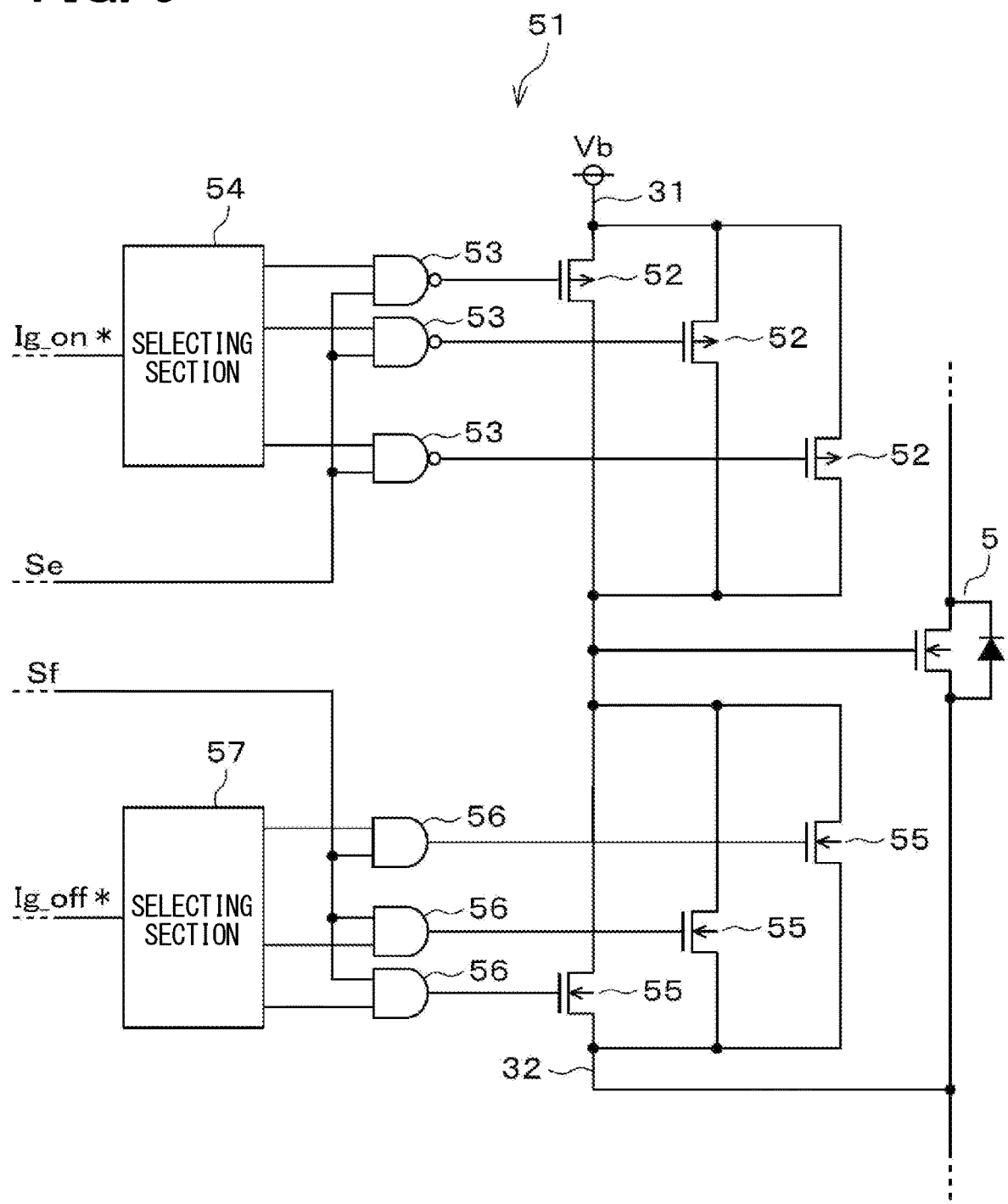
FIG. 9 is a figure depicting a specific first configuration example of a gate drive circuit according to the first embodiment, and the second embodiment.

As depicted in FIG. 9, a gate drive circuit 51 according to a first configuration example includes an output stage having a configuration in which a plurality of transistors is connected in parallel. Note that whereas a configuration in which three transistors are connected in parallel is illustrated as an example here, the number of transistors to be connected in parallel may not be limited to three, but may be two or four or greater. Specifically, the gate drive circuit 51 includes three transistors 52, three NAND circuits 53, and a selecting section 54 that are included in the output stage on the turn-on side, and includes three transistors 55, three AND circuits 56, and a selecting section 57 that are included in the output stage on the turn-off side.

The three transistors 52 are P-channel MOS transistors, and each source of them is connected commonly, and also is connected to the power supply line 31. Each drain of the three transistors 52 is connected commonly, and also is connected to the gate of the semiconductor switching element 5. Each gate of the three transistors 52 receives, as input, an output signal of a corresponding one of the three NAND circuits 53. One input terminal of each of the three NAND circuits 53 receives an output signal of the selecting section 54 as input, and the other input terminal of it receives an ON command signal Se as input.

The ON command signal Se is a binary signal generated on the basis of the command signals Sa, and Sb given from the controller 6, and becomes a high level signal when a command for turning on the semiconductor switching element 5 is given, that is, when a command for gate ON is given. On the basis of the signal Ig_on*, the selecting section 54 selects one of the three transistors 52 to be turned on, and outputs a signal for turning on the selected transistor 52. According to such a configuration, during a period in which the ON command signal Se is at the high level, a transistor 52 selected on the basis of the signal Ig_on* can be turned on.

According to the configuration described above, when a transistor 52 is turned on, it becomes possible to cause the gate current Ig_on to flow in an amount corresponding to a saturation current of the transistor 52 having been turned on. Accordingly, according to the configuration described above, the current value of the gate current Ig_on can be set as desired by adjusting a transistor 52 to be turned on. In addition, according to the configuration described above, it is also possible to adjust the number of transistors 52 to be turned on, and, by doing so, the current value of the gate current Ig_on can be set more finely.

The three transistors 55 are N-channel MOS transistors, and each source of them is connected commonly, and also is connected to the power supply line 32. Each drain of the three transistors 55 is connected commonly, and also is connected to the gate of the semiconductor switching element 5. Each gate of the three transistors 55 receives, as input, an output signal of a corresponding one of the three AND circuits 56. One input terminal of each of the three AND circuits 56 receives an output signal of the selecting section 57 as input, and the other input terminal of it receives an OFF command signal Sf as input.

The OFF command signal Sf is a binary signal generated on the basis of the command signals Sa, and Sb given from the controller 6, and becomes a high level signal when a command for turning off the semiconductor switching element 5 is given, that is, when a command for gate OFF is given. On the basis of the signal Ig_off*, the selecting section 57 selects one of the three transistors 55 to be turned on, and outputs a signal for turning on the selected transistor 55. According to such a configuration, during a period in which the OFF command signal Sf is at the high level, a transistor 55 selected on the basis of the signal Ig_off* can be turned on.

According to the configuration described above, when a transistor 55 is turned on, it becomes possible to cause the gate current Ig_off to flow in an amount corresponding to a saturation current of the transistor 55 having been turned on. Accordingly, according to the configuration described above, the current value of the gate current Ig_off can be set as desired by adjusting a transistor 55 to be turned on. In addition, according to the configuration described above, it is also possible to adjust the number of transistors 55 to be turned on, and, by doing so, the current value of the gate current Ig_off can be set more finely.

In a case that the gate drive circuit 51 having the configuration described above is used as the gate drive circuit 11 according to the first embodiment, the speed change circuit 15 changes the gate drive speed by adjusting the number of transistors 52 to be turned on. In addition, in a case that the gate drive circuit 51 having the configuration described above is used as the gate drive circuit 42 according to the second embodiment, the speed change circuit 45 changes the gate drive speed by adjusting the number of transistors 55 to be turned on. In the configuration described above, the transistors 52, and 55 function as the current source 26, and the switch 28. In addition, in the configuration described above, the NAND circuit 53, the selecting section 54, the AND circuit 56, and the selecting section 57 function as the gate drive logic 30.

[2] Second Configuration Example

Figure 10:
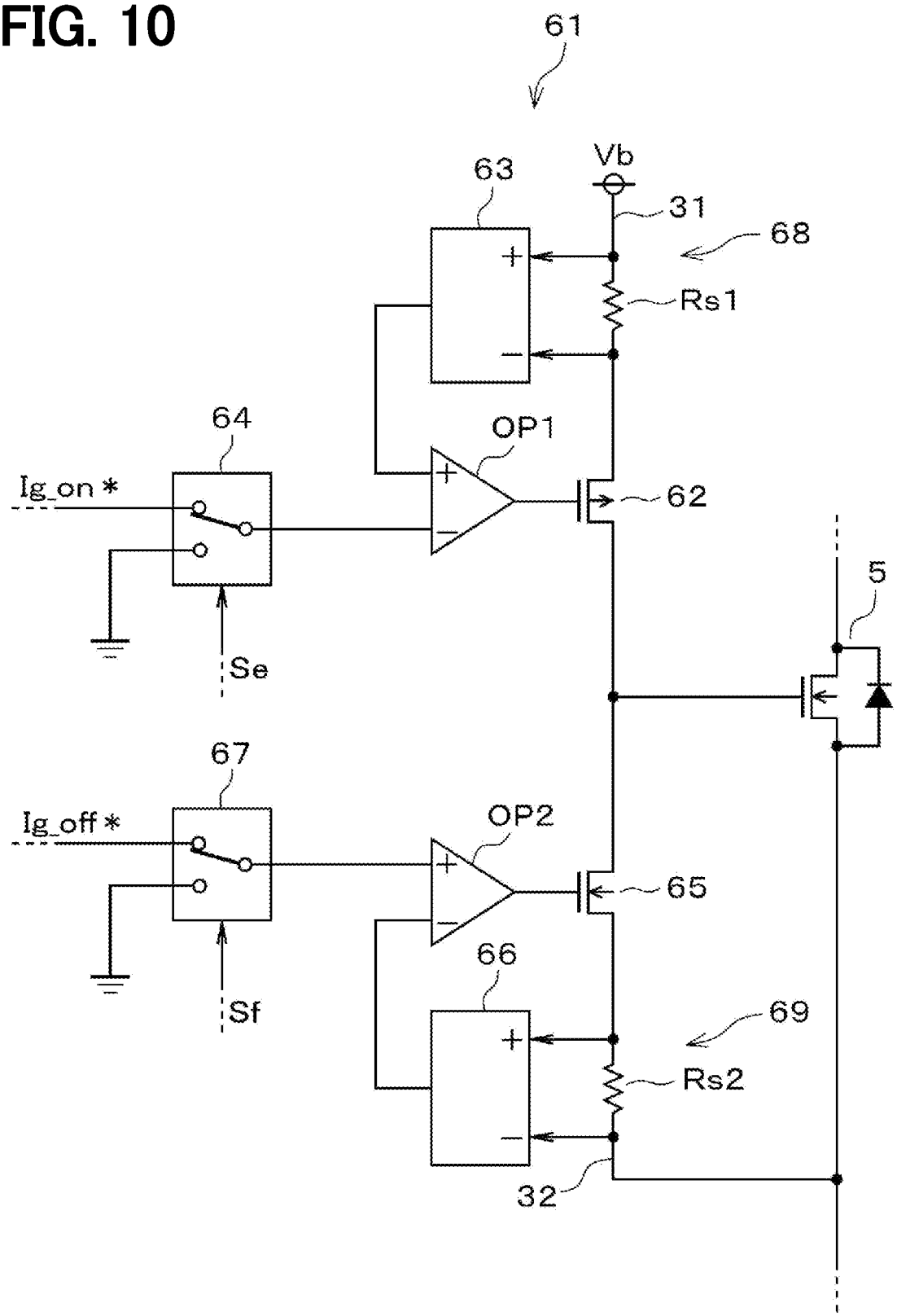
FIG. 10 is a figure depicting a specific second configuration example of a gate drive circuit according to the first embodiment, and the second embodiment.

As depicted in FIG. 10, a gate drive circuit 61 according to a second configuration example includes a transistor 62, a shunt resistor Rs1, a sensing section 63, an OP amplifier OP1, and a switch 64 that are included in the output stage on the turn-on side, and includes a transistor 65, a shunt resistor Rs2, a sensing section 66, an OP amplifier OP2, and a switch 67 that are included in the output stage on the turn-off side.

The transistor 62 is a P-channel MOS transistor, and has a source that is connected to the power supply line 31 via the shunt resistor Rs1. The drain of the transistor 62 is connected to the gate of the semiconductor switching element 5. The sensing section 63 outputs a signal corresponding to a voltage obtained by subtracting the voltage of the downstream terminal of the shunt resistor Rs1 from the voltage of the upstream terminal, that is, the inter-terminal voltage of the shunt resistor Rs1. The signal output from sensing section 63 is a signal according to a current to flow between the main terminals of the transistor 62, that is, the gate current Ig_on of the semiconductor switching element 5.

In the configuration described above, the shunt resistor Rs1, and the sensing section 63 function as a current sensing section 68 that senses the gate current Ig_on which is a current to flow to the gate of the semiconductor switching element 5. The non-inverted input terminal of the OP amplifier OP1 receives, as input, a signal output from the sensing section 63, and the inverted input terminal of the OP amplifier OP1 receives, as input, a signal output from the switch 64. An output signal of the OP amplifier OP1 is input to the gate of the transistor 62.

The switch 64 selects and outputs either one of the signals input to the two input terminals. One input terminal of the switch 64 receives, as input, the signal Ig_on*, and the other input terminal receives, as input, a signal of the ground potential, that is, 0 V. On the basis of the ON command signal Se, the switch 64 outputs, from the output terminal, either one of the signal Ig_on*, and the signal of 0V. Specifically, the switch 64 outputs the signal of 0V when the ON command signal Se is at the low level, and also outputs the signal Ig_on* when the ON command signal Se is at the high level.

According to such a configuration, during a period in which the ON command signal Se is at the high level, the drive state of the transistor 62 is controlled such that the level of the signal output from the sensing section 63 is equal to the level of the signal Ig_on*. That is, according to the configuration described above, during a period when the ON command signal Se is at the high level, the drive state of the transistor 62 at the output stage is controlled such that the sensing value of the current sensing section 68 becomes equal to the current command value Ig_on* which is the command value of the gate current Ig_on. In this manner, according to the configuration described above, the current value of the gate current Ig_on can be adjusted precisely.

The transistor 65 is an N-channel MOS transistor, and has a source that is connected to the power supply line 32 via the shunt resistor Rs2. The drain of the transistor 65 is connected to the gate of the semiconductor switching element 5. The sensing section 66 outputs a signal corresponding to a voltage obtained by subtracting the voltage of the downstream terminal of the shunt resistor Rs2 from the voltage of the upstream terminal, that is, the inter-terminal voltage of the shunt resistor Rs2. The signal output from sensing section 66 is a signal according to a current to flow between the main terminals of the transistor 65, that is, the gate current Ig_off of the semiconductor switching element 5.

In the configuration described above, the shunt resistor Rs2, and the sensing section 66 function as a current sensing section 69 that senses the gate current Ig_off which is a current to flow to the gate of the semiconductor switching element 5. The inverted input terminal of the OP amplifier OP2 receives, as input, a signal output from the sensing section 66, and the non-inverted input terminal of the OP amplifier OP2 receives, as input, a signal output from the switch 67. An output signal of the OP amplifier OP2 is input to the gate of the transistor 65.

The switch 67 selects and outputs either one of the signals input to the two input terminals. One input terminal of the switch 67 receives, as input, the signal Ig_off*, and the other input terminal receives, as input, a signal of the ground potential, that is, 0 V. On the basis of the OFF command signal Sf, the switch 67 outputs, from the output terminal, either one of the signal Ig_off*, and the signal of 0V. Specifically, the switch 67 outputs the signal of 0V when the OFF command signal Sf is at the low level, and also outputs the signal Ig_off* when the OFF command signal Sf is at the high level.

According to such a configuration, during a period in which the OFF command signal Sf is at the high level, the drive state of the transistor 65 is controlled such that the level of the signal output from the sensing section 66 is equal to the level of the signal Ig_off*. That is, according to the configuration described above, during a period when the OFF command signal Sf is at the high level, the drive state of the transistor 65 at the output stage is controlled such that the sensing value of the current sensing section 69 becomes equal to the current command value Ig_off* which is the command value of the gate current Ig_off. In this manner, according to the configuration described above, the current value of the gate current Ig_off can be adjusted precisely.

In a case that the gate drive circuit 61 having the configuration described above is used as the gate drive circuit 11 according to the first embodiment, the speed change circuit 15 changes the gate drive speed by adjusting the current command value Ig_off* which is the command value of the gate current Ig_off. In addition, in a case that the gate drive circuit 61 having the configuration described above is used as the gate drive circuit 42 according to the second embodiment, the speed change circuit 45 changes the gate drive speed by adjusting the current command value Ig_on* which is the command value of the gate current Ig_on. In the configuration described above, the transistors 62, and 65 function as the current source 26, and the switch 28. In addition, in the configuration described above, the sensing section 63, the OP amplifier OP1, the switch 64, the sensing section 66, the OP amplifier OP2, and the switch 67 function as the gate drive logic 30.

Third Embodiment

Figure 11:
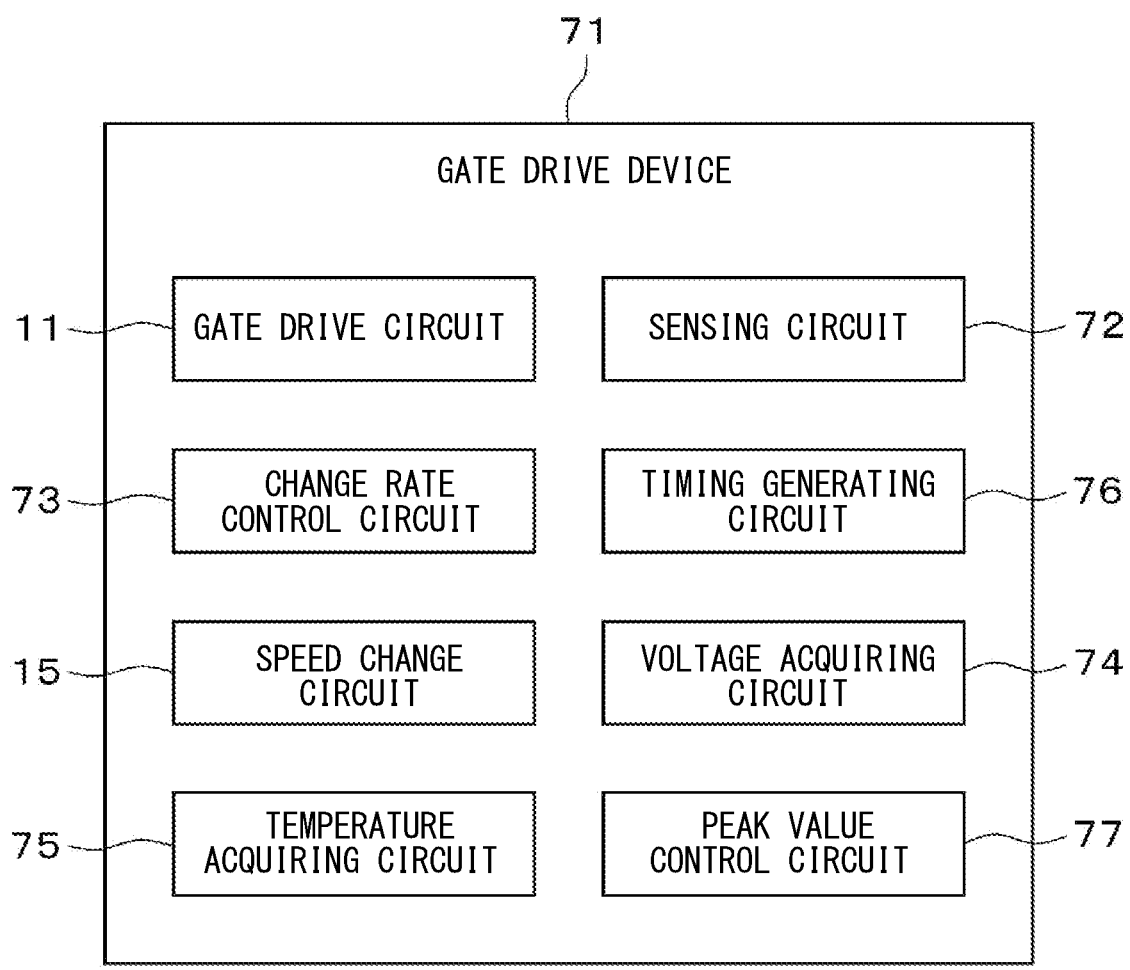
FIG. 11 is a figure schematically depicting main functionalities of a gate drive device according to a third embodiment.

A third embodiment is explained below with reference to FIG. 11 to FIG. 13.

<Main Functionalities of Gate Drive Device>

Main functionalities of a gate drive device 71 according to the present embodiment are explained with reference to FIG. 11. In addition to functionalities similar to the functionalities of the sensing circuit 12 according to the first embodiment, a sensing circuit 72 has a functionality of sensing the peak value Vds_p of the voltage Vds of the semiconductor switching element 5 during a change period on the basis of the physical quantity mentioned before.

A change rate control circuit 73 has functionalities approximately similar to the functionalities of the change rate control circuit 13 according to the first embodiment. It should be noted that the change rate control circuit 73 is configured to compute such a first drive speed that the difference between the target change rate dV/dt* and the change rate dV/dt of the voltage Vds obtained from sensing value of the sensing circuit 72 is made zero. A voltage acquiring circuit 74 acquires the value of the power supply voltage Va supplied to the half bridge circuit 4. A temperature acquiring circuit 75 acquires a value of at least one of the temperature of the semiconductor switching element 5, and the temperature of the gate drive device 71.

A timing generating circuit 76 has functionalities approximately similar to the functionalities of the timing generating circuit 14 according to the first embodiment. It should be noted that, in this case, the timing generating circuit 76 is configured to acquire, in advance, the delay time td of each power supply voltage Va having a value which is different from each other, and determine a switching timing on the basis of the delay time td according to the value of the power supply voltage Va acquired by the voltage acquiring circuit 74. In addition, in this case, the timing generating circuit 76 is configured to acquire, in advance, the delay time td of each temperature having a value which is different from each other, and determine a switching timing on the basis of the delay time td according to a value of the temperature acquired by the temperature acquiring circuit 75.

On the basis of the sensing value of the sensing circuit 72, and a target peak value Vds_p* which is the target value of the peak value Vds_p of the voltage Vds during a change period, a peak value control circuit 77 computes the second drive speed which is the gate drive speed of the semiconductor switching element 5 for controlling the peak value Vds_p of the voltage Vds during the change period such that the peak value Vds_p becomes the target peak value Vds_p*. In this case, the peak value control circuit 77 is configured to compute the second current value Ig2 which is the current value of the gate current Ig_off corresponding to the second drive speed.

In this case, immediately after the start of operation of the gate drive device 71, and immediately after the output state where the change permission signal is output has switched to the stopped state where output of the change permission signal is stopped, the change rate control circuit 73 sets the target change rate dV/dt* to a value smaller than the original value. Thereafter, the change rate control circuit 73 is configured to start increasing the target change rate dV/dt to the original value under the condition that the peak value Vds_p of the voltage Vds during a change period is equal to or smaller than a preset tolerance, and output the change permission signal when it is sensed that the difference between the change rate dV/dt and the target change rate dV/dt* is stabilized at a value smaller than the error tolerance e in a state that the target change rate dV/dt has become the original value.

<Specific Configuration of Gate Drive Device>

Figure 12:
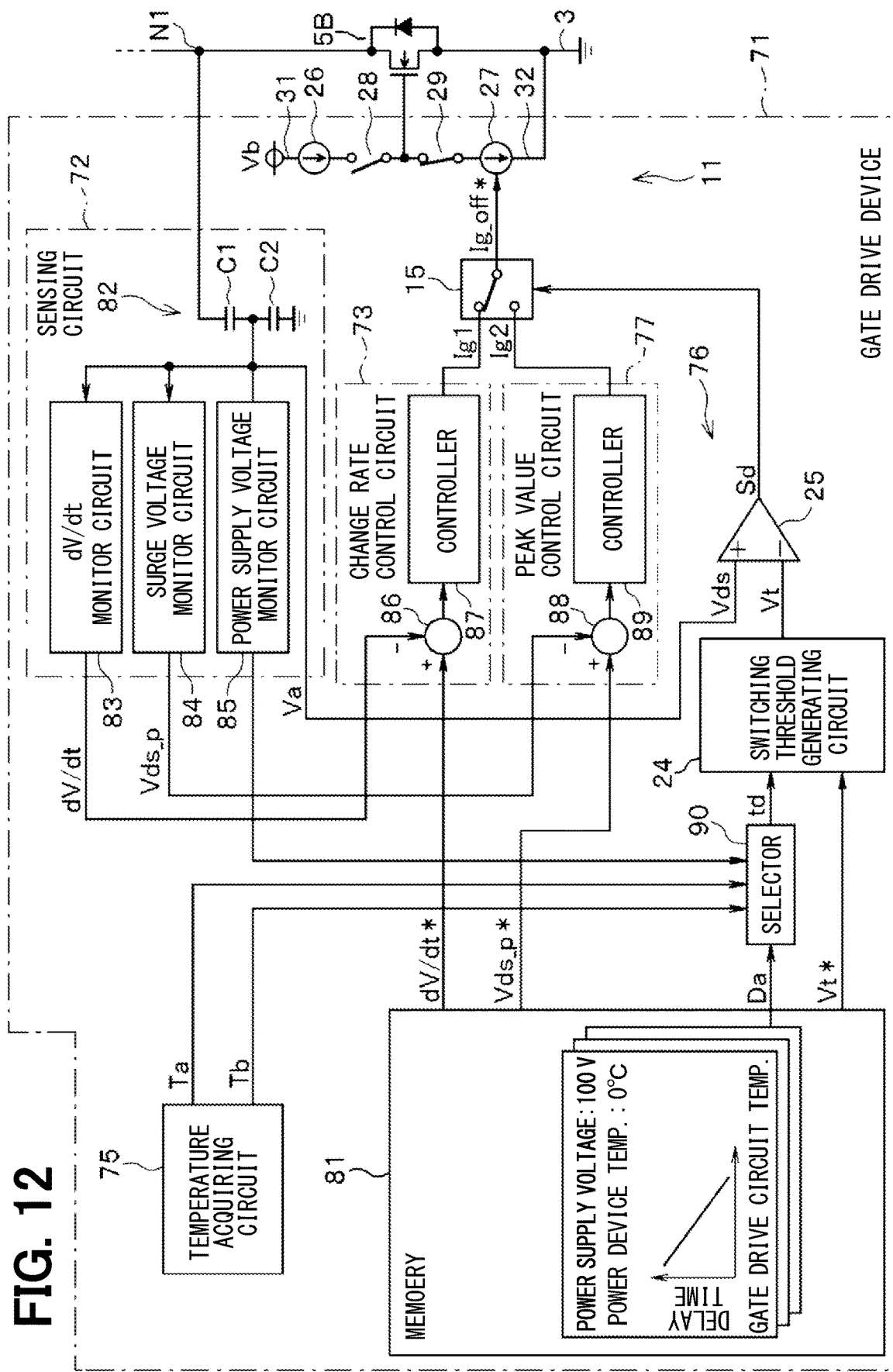
FIG. 12 is a figure depicting an example of the specific configuration of the gate drive device according to the third embodiment.

As the specific configuration of the gate drive device 71 having functionalities like the ones described above, a configuration example like the one depicted in FIG. 12 can be adopted, for example. The gate drive device 71 depicted in FIG. 12 is different from the gate drive device 1 according to the first embodiment depicted in FIG. 4 in that the gate drive device 71 includes the sensing circuit 72, the change rate control circuit 73, the timing generating circuit 76, and a memory 81 instead of the sensing circuit 12, the change rate control circuit 13, the timing generating circuit 14, and the memory 23, that the temperature acquiring circuit 75, and the peak value control circuit 77 are added, and so on. Note that the gate drive logic 30 is not depicted, but omitted in FIG. 12.

The memory 81 has stored thereon in advance the target change rate dV/dt*, the switching voltage Vt*, the target peak value Vds_p*, and the like. The delay time td changes depending on the temperature of the gate drive device 71, the temperature of the semiconductor switching element 5, the power supply voltage Va, and the like. In view of this, the memory 81 has stored thereon map data Da representing a relationship between the delay time td and the temperature of the gate drive device 71, a relationship between the delay time td and the temperature of the semiconductor switching element 5, a relationship between the delay time td and the power supply voltage Va, and the like. The values, and the map data Da that are stored on the memory 81 can be acquired in advance by performing various types of simulation, and so on, for example.

The sensing circuit 72 includes a voltage dividing circuit 82 that divides the voltage of the drain of the subject-arm semiconductor switching element 5 by two capacities C1, and C2, and is configured to sense the voltage Vds on the basis of the output voltage of the voltage dividing circuit 82. In this case, the sensing circuit 12 includes a dV/dt monitor circuit 83, a surge voltage monitor circuit 84, and a power supply voltage monitor circuit 85. On the basis of the output voltage of the voltage dividing circuit 82, the dV/dt monitor circuit 83 senses the change rate dV/dt of the voltage Vds, and outputs a signal representing the sensing value.

On the basis of the output voltage of the voltage dividing circuit 82, the surge voltage monitor circuit 84 senses the peak value Vds_p of the voltage Vds, and outputs a signal representing the sensing value. On the basis of the output voltage of the voltage dividing circuit 82, the power supply voltage monitor circuit 85 senses the OFF voltage Vds_off generated when the semiconductor switching element 5 is turned off, and estimates and acquires the value of the power supply voltage Va on the basis of the sensing value. The power supply voltage monitor circuit 85 outputs a signal corresponding to the value of the power supply voltage Va. In the configuration described above, the power supply voltage monitor circuit 85 functions as the voltage acquiring circuit 74.

The change rate control circuit 73 includes a subtractor 86, and a controller 87. The subtractor 86 receives the signal dV/dt, and the signal dV/dt* as input. The subtractor 86 determines the deviation of the change rate dV/dt by subtracting the change rate from the target change rate dV/dt*, and outputs the deviation of the change rate to the controller 87. The controller 87 is a PID controller, executes a PID computation on the deviation of the change rate output from the subtractor 86, determines the first current value Ig1 corresponding to the first drive speed, and outputs a signal representing the first current value Ig1.

The peak value control circuit 77 includes a subtractor 88, and a controller 89. The subtractor 88 receives a signal Vds_p, and a signal Vds_p* as input. The subtractor 88 determines the deviation of the peak value Vds_p by subtracting the peak value from the target peak value Vds_p*, and outputs the deviation of the peak value to the controller 89. The controller 89 is a PID controller, executes a PID computation on the deviation of the peak value output from the subtractor 88, determines the second current value Ig2 corresponding to the second drive speed, and outputs a signal representing the second current value Ig2. Note that various types of controller that perform PI computations, that perform P computations, that perform other feedback control, and so on can be adopted as the controllers 87, and 89.

The temperature acquiring circuit 75 acquires a temperature Ta of the semiconductor switching element 5 sensed by a temperature sensor or the like, and outputs a signal representing the value of the temperature Ta. In addition, the temperature acquiring circuit 75 acquires a temperature Tb of the gate drive device 71 sensed by a temperature sensor or the like, and outputs a signal representing the value of the temperature Tb. The timing generating circuit 76 includes a selector 90 in addition to the configuration included in the timing generating circuit 14 according to the first embodiment.

The selector 90 receives the map data Da, the signal Va, the signal Ta, and the signal Tb as input. On the basis of the map data Da, and the signals Va, Ta, and Tb, the selector 90 decides the optimum delay time Td according to the value of the power supply voltage Va, the value of the temperature Ta, and the value of the temperature Tb, and outputs a signal representing the decided delay time td to the switching threshold generating circuit 24. According to such a configuration, the switching threshold voltage Vt is generated by using the optimum delay time td in accordance with various types of state of the gate drive device 71.

<Overview of Processes of Each Functionality>

Next, the flow of operation by the gate drive device 71 having the configuration described above is explained with reference to FIG. 13. In the gate drive device 71, a process with contents like the ones depicted in the flowchart of FIG. 13 is executed repeatedly for each instance of switching of the subject-arm semiconductor switching element 5. In the present process, the gate drive device 71 makes a transition to one of a first state, a second state, a third state, and a fourth state mentioned later. Note that the gate drive device 71 is configured to make a transition to the first state at time of first switching at the starting time point of the present process, and takes over the state after a transition in the previous process at time of second and subsequent switching.

Figure 13:
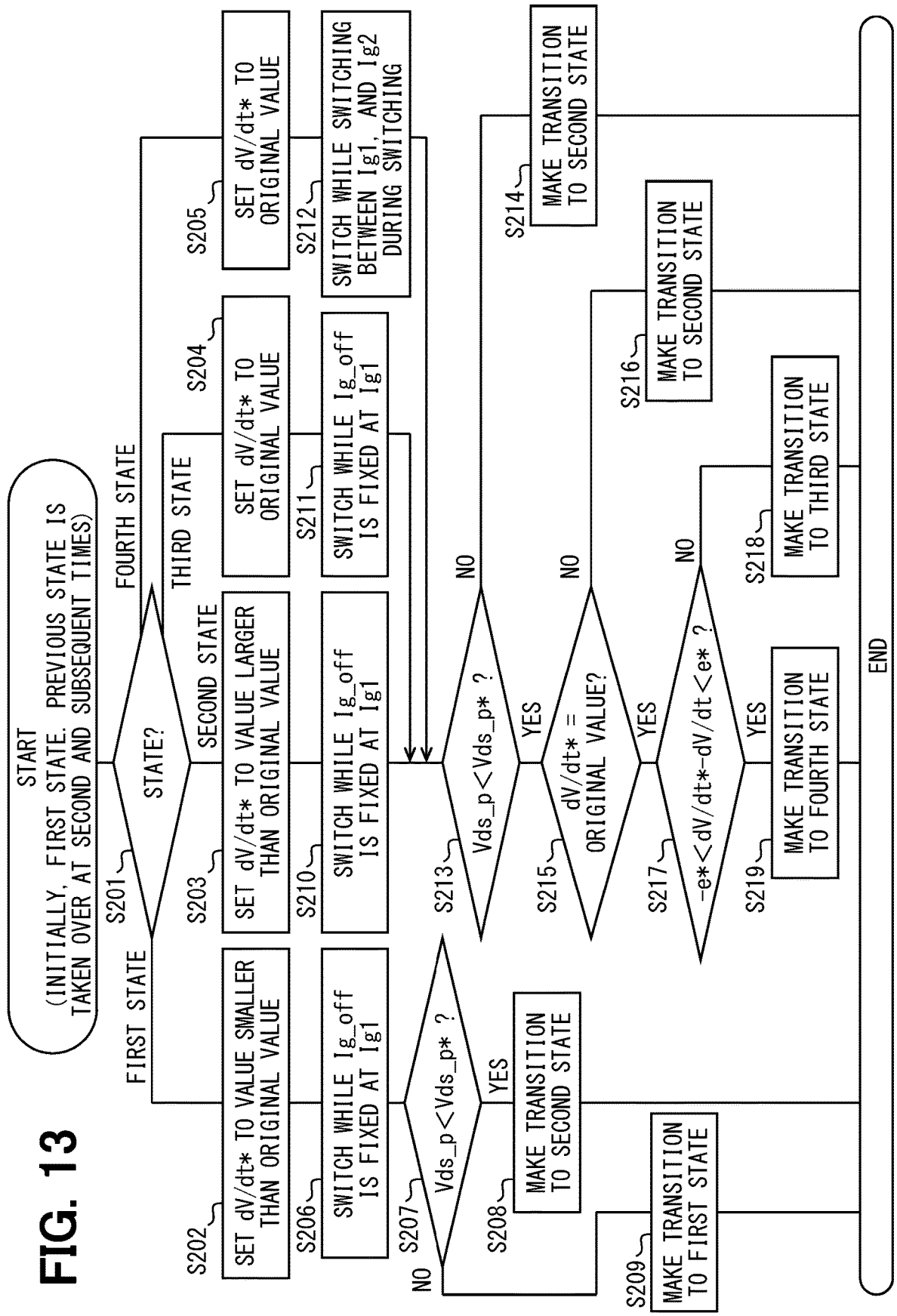
FIG. 13 is a figure schematically depicting the operation flow of the gate drive device according to the third embodiment.

As depicted in FIG. 13, at Step S201 executed first after the start of the process, the state of the gate drive device 71 is determined. In a case that the state of the gate drive device 71 is the first state, the process proceeds to Step S202, in a case that the state of the gate drive device 71 is the second state, the process proceeds to Step S203, in a case that the state of the gate drive device 71 is the third state, the process proceeds to Step S204, and in a case that the state of the gate drive device 71 is the fourth state, the process proceeds to Step S205. At Step S202, the target change rate dV/dt* is set to a value smaller than an original value. After the execution of Step S202, the process proceeds to Step S206.

At Step S206, switching is performed while the gate current Ig_off is fixed at the first current value Ig1. After the execution of Step S206, the process proceeds to Step S207. At Step S207, it is determined whether or not the peak value Vds_p is smaller than the target peak value Vds_p*, that is, whether or not the surge voltage is lower than the tolerance. In a case that the peak value Vds_p is smaller than the target peak value Vds_p*, the result of the determination at Step S207 is "YES," and the process proceeds to Step S208. At Step S208, the state of the gate drive device 71 makes a transition to the second state. On the other hand, in a case that the peak value Vds_p is equal to or greater than the target peak value Vds_p*, the result of the determination at Step S207 is "NO," and the process proceeds to Step S209. At Step S209, the state of the gate drive device 71 makes a transition to the first state. After the execution of Step S208 or S209, the present process ends.

At Step S203, the target change rate dV/dt* is set to a value greater than the previous value. Note that the upper limit value of the target change rate dV/dt* in the setting here is the original value. After the execution of Step S203, the process proceeds to Step S210. At Step S210, switching is performed while the gate current Ig_off is fixed at the first current value Ig1. At Step S204, the target change rate dV/dt* is set to the original value. After the execution of Step S204, the process proceeds to Step S211. At Step S211, switching is performed while the gate current Ig_off is fixed at the first current value Ig1.

At Step S205, the target change rate dV/dt* is set to the original value. After the execution of Step S205, the process proceeds to Step S212. At Step S212, switching is performed while the gate current Ig_off is switched from the first current value Ig1 to the second current value Ig2 during the switching. After the execution of Step S210, S211 or S212, the process proceeds to Step S213. At Step S213, it is determined whether or not the peak value Vds_p is smaller than the target peak value Vds_p*.

In a case that the peak value Vds_p is equal to or greater than the target peak value Vds_p*, the result of the determination at Step S213 is "NO," and the process proceeds to Step S214. At Step S214, the state of the gate drive device 71 makes a transition to the first state. On the other hand, in a case that the peak value Vds_p is smaller than the target peak value Vds_p*, the result of the determination at Step S213 is "YES," and the process proceeds to Step S215. At Step S215, it is determined whether or not the target change rate dV/dt* is the original value. In a case that the target change rate dV/dt* is not the original value, the result of the determination at Step S215 is "NO," and the process proceeds to Step S216. At Step S216, the state of the gate drive device 71 makes a transition to the second state.

On the other hand, in a case that the target change rate dV/dt* is the original value, the result of the determination at Step S215 is "YES," and the process proceeds to Step S217. At Step S217, it is determined whether or not the difference between the change rate dV/dt and the target change rate dV/dt* is stabilized at a value smaller than the error tolerance e*. Specifically, it is determined whether or not the difference described above satisfies Formula (4) mentioned before. In a case that the difference described above does not satisfy Formula (4), that is, in a case that the difference described above is equal to or greater than the error tolerance e*, the result of the determination at Step S217 is "NO," and the process proceeds to Step S218.

At Step S218, the state of the gate drive device 71 makes a transition to the third state. On the other hand, in a case that the difference described above satisfies Formula (4), that is, in a case that the difference described above is stabilized at a value smaller than the error tolerance e*, the result of the determination at Step S217 is "YES," and the process proceeds to Step S219. At Step S219, the state of the gate drive device 71 makes a transition to the fourth state. After the execution of Step S214, S216, S218 or S219, the present process ends.

According to the present embodiment explained above, advantages like the ones mentioned below are attained. There is a possibility that the actual delay time td changes depending on the temperature Ta of the semiconductor switching element 5, the temperature Tb of the gate drive device 71, the temperature of the power supply voltage Va, and the like. If the actual delay time td has a value which is significantly different from the delay time td used when the switching threshold voltage Vt is computed, there is a risk that the precision of computation of the switching threshold voltage Vt lowers; as a result, switching of the gate current Ig_off is not performed at a desired switching timing.

In view of this, in the present embodiment, the timing generating circuit 76 is configured to acquire, in advance, the delay time td of each power supply voltage Va having a value which is different from each other, and determine a switching timing on the basis of the delay time td according to the value of the power supply voltage Va acquired by the voltage acquiring circuit 74. By adopting this configuration, the likelihood that the switching timing differs from the desired timing due to the dependence of the delay time td on the power supply voltage Va is reduced, and enhancement of the precision of the switching timing is realized by a corresponding amount.

In addition, in the present embodiment, the timing generating circuit 76 is configured to acquire, in advance, the delay time td of each temperature Ta of the gate drive device 71 having a value which is different from each other, and determine a switching timing on the basis of the delay time td according to the value of the temperature Ta acquired by the temperature acquiring circuit 75. By adopting this configuration, the likelihood that the switching timing differs from the desired timing due to the dependence of the delay time td on the temperature Ta is reduced, and enhancement of the precision of the switching timing is realized by a corresponding amount.

Furthermore, in the present embodiment, the timing generating circuit 76 is configured to acquire, in advance, the delay time td of each temperature Tb of the semiconductor switching element 5 having a value which is different from each other, and determine a switching timing on the basis of the delay time td according to the value of the temperature Tb acquired by the temperature acquiring circuit 75. By adopting this configuration, the likelihood that the switching timing differs from the desired timing due to the dependence of the delay time td on the temperature Tb is reduced, and enhancement of the precision of the switching timing is realized by a corresponding amount.

In the configuration described above, the sensing circuit 72 includes the voltage dividing circuit 82 that divides the voltage between main terminals of the semiconductor switching element 5 by the capacities C1, and C2, and is configured to sense the voltage Vds on the basis of the output voltage of the voltage dividing circuit 82. According to such a configuration, application even to a system having a relatively high power supply voltage Va is possible.

The gate drive device 71 according to the present embodiment includes the peak value control circuit 77 that computes the second drive speed which is the gate drive speed of the semiconductor switching element 5 for controlling the peak value Vds_p of the voltage Vds during a change period such that the peak value Vds_p becomes the target peak value Vds_p*, and in turn computes the second current value Ig2 corresponding to the second drive speed, on the basis of the sensing value of the sensing circuit 72, and the target peak value Vds_p* which is the target value of the peak value Vds_p of the voltage Vds during the change period. According to such a configuration, control is performed such that the surge voltage becomes lower than the tolerance when the gate current Ig_off is switched to the second current value Ig2, and the gate drive speed is set to the second drive speed, and so the surge voltage reduction effect can be enhanced further.

In the configuration described above, the change rate control circuit 73 is configured to set the target change rate dV/dt* to a value smaller than the original value immediately after the start of operation of the gate drive device 71, and immediately after the output state where the change permission signal is output has switched to the stopped state where output of the change permission signal is stopped, thereafter starts increasing the target change rate dV/dt* to the original value under the condition that the peak value Vds_p during a change period is equal to or smaller than the preset tolerance, and outputs the change permission signal if it is sensed that the difference between the change rate dV/dt and the target change rate dV/dt* is stabilized at a value smaller than the error tolerance e in a state that the target change rate dV/dt* has become the original value. According to such a configuration, an increase of the surge voltage over the tolerance is prevented when switching of the gate current Ig_off is stopped, and the first current value Ig1 is fixed at time of the start or the like, for example, and so it is possible to enhance the safety.

Fourth Embodiment

Figure 14:
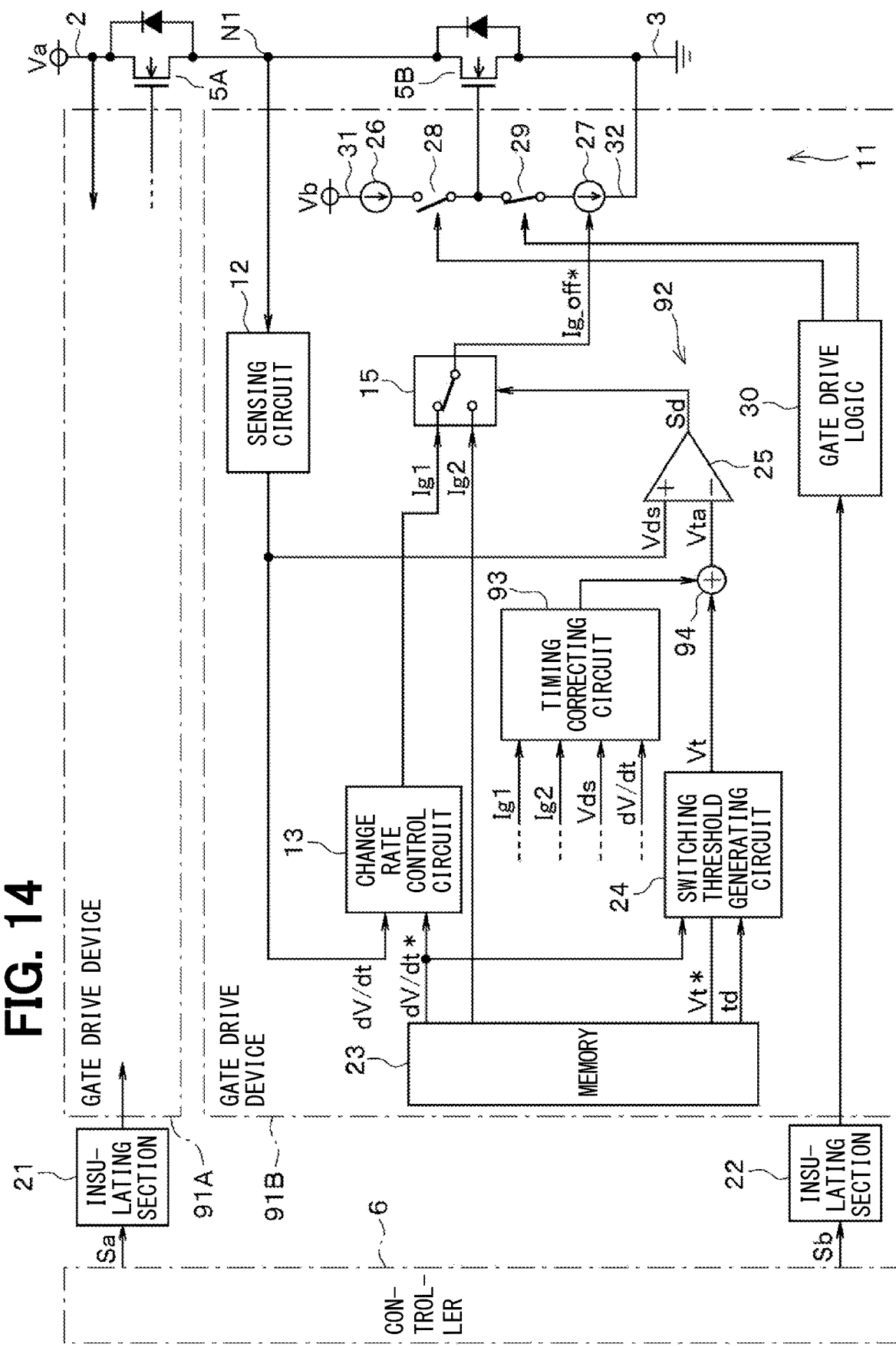
FIG. 14 is a figure depicting an example of the specific configuration of a gate drive device according to a fourth embodiment.
Figure 16:
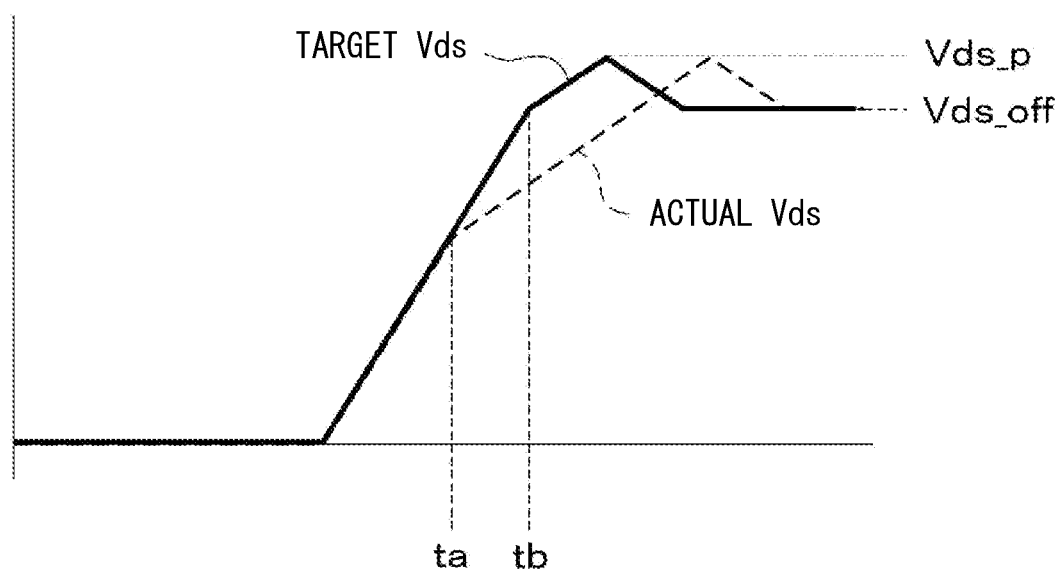
FIG. 16 is a figure schematically depicting an example of the target waveform, and an actual waveform of a drain-source voltage according to the fourth embodiment.

A fourth embodiment is explained below with reference to FIG. 14 to FIG. 16. As depicted in FIG. 14, a gate drive device 91 according to the present embodiment is different from the gate drive device 1 according to the first embodiment depicted in FIG. 4 in that the gate drive device 91 includes a timing generating circuit 92 instead of the timing generating circuit 14, and so on. The timing generating circuit 92 is configured to adjust a switching timing on the basis of the first drive speed, the second drive speed, and the sensing value of the sensing circuit 12.

In order to realize such a functionality, the timing generating circuit 92 includes a timing correcting circuit 93, and an adder 94 in addition to the configuration included in the timing generating circuit 14. The timing correcting circuit 93 receives, as input, the signal representing the first current value Ig1 corresponding to the first drive speed, the signal representing the second current value Ig2 corresponding to the second drive speed, the signal dV/dt representing the sensing value of the sensing circuit 12, and the voltage Vds. On the basis of current values before and after a change of the gate current Ig_off, that is, the first current value Ig1, and the current value Ig2, the value of an actually generated surge voltage that can be estimated on the basis of the voltage Vds, and the value of the change rate dV/dt, the timing correcting circuit 93 determines whether or not the switching timing of the gate current Ig_off is the desired timing, that is, the target timing, specifically, whether the switching timing matches the target, is earlier than the target or is later than the target.

In this case, the average value of the change rate dV/dt during a change period in which the voltage Vds changes can be treated as the value of the change rate dV/dt. On the basis of the result of such a determination, the timing correcting circuit 93 generates and outputs an adjustment voltage Vc for adjusting the switching threshold voltage Vt such that the switching timing becomes the target timing. The adder 94 outputs, to the comparator 25, a switching threshold voltage Vta after the adjustment that can be obtained by adding the adjustment voltage Vc to the switching threshold voltage Vt.

The timing correcting circuit 93 can perform operation mentioned above on the basis of a table like the one depicted in FIG. 15, for example. That is, in a case that the first current value Ig1 is greater than the second current value Ig2, the surge voltage matches the target, and the change rate dV/dt is lower than the target, the timing correcting circuit 93 determines that the switching timing is earlier than the target, and makes an adjustment to increase the switching threshold voltage Vt. In this case, the waveform of the voltage Vds is a waveform like the one depicted in FIG. 16. Note that, in FIG. 16, the target voltage-Vds waveform is represented by a thick solid line, and the actual voltage-Vds waveform is represented by a dotted line. As depicted in FIG. 16, in a case that the first current value Ig1 is larger the second current value Ig2, the surge voltage matches the target, and the change rate dV/dt is lower than the target, a time to which is the actual switching timing is a timing earlier than a time tb which is the target switching timing.

In a case that the first current value Ig1 is greater than the second current value Ig2, the surge voltage is greater than the target, and the change rate dV/dt matches the target, the timing correcting circuit 93 determines that the switching timing is later than the target, and makes an adjustment to lower the switching threshold voltage Vt. In a case that the first current value Ig1 is greater than the second current value Ig2, the surge voltage matches the target, and the change rate dV/dt matches the target, the timing correcting circuit 93 determines that the switching timing matches the target, and does not make an adjustment to the switching threshold voltage Vt.

In a case that the first current value Ig1 is smaller than the second current value Ig2, the surge voltage matches the target, and the change rate dV/dt is higher than the target, the timing correcting circuit 93 determines that the switching timing is earlier than the target, and makes an adjustment to increase the switching threshold voltage Vt. In a case that the first current value Ig1 is smaller than the second current value Ig2, the surge voltage is lower than the target, and the change rate dV/dt matches the target, the timing correcting circuit 93 determines that the switching timing is later than the target, and makes an adjustment to lower the switching threshold voltage Vt. In a case that the first current value Ig1 is smaller than the second current value Ig2, the surge voltage matches the target, and the change rate dV/dt matches the target, the timing correcting circuit 93 determines that the switching timing matches the target, and does not make an adjustment to the switching threshold voltage Vt.

Note that the first current value Ig1 can become smaller than the second current value Ig2 in a case like the one mentioned below. That is, the tolerance of the surge voltage is a value according to the element withstand voltage of the semiconductor switching element 5. On the other hand, because noise accompanying switching increases as the change rate dV/dt increases, the change rate dV/dt is controlled such that the change rate dV/dt becomes a value according to specifications related to noise of the system.

Accordingly, in a case that the specifications of the system are not favorable in terms of noise, it is necessary to keep the change rate dV/dt low, and so the first current value Ig1 has to be kept low. On the other hand, in a case that an element having a high element withstand voltage is used as the semiconductor switching element 5, the tolerance of the surge voltage becomes relatively high, and so it becomes possible to increase the second current value Ig2. In this manner, in a case that the specifications of the system are not favorable in terms of noise, and additionally an element having a high element withstand voltage is used as the semiconductor switching element 5, there is a possibility the first current value Ig1 is smaller than the second current value Ig2.

According to the present embodiment explained above, advantages like the ones mentioned below are attained. In the present embodiment, the timing generating circuit 92 is configured to adjust a switching timing on the basis of the first current value Ig1 corresponding to the first drive speed, the second current value Ig2 corresponding to the second drive speed, the value of the surge voltage obtained from the sensing value of the sensing circuit 12, and the value of the change rate dV/dt. According to such a configuration, the actual switching timing is adjusted such that the actual switching timing becomes the target switching timing, and so switching of the gate drive speed at a desired timing can be realized still highly precisely.

Fifth Embodiment

Figure 17:
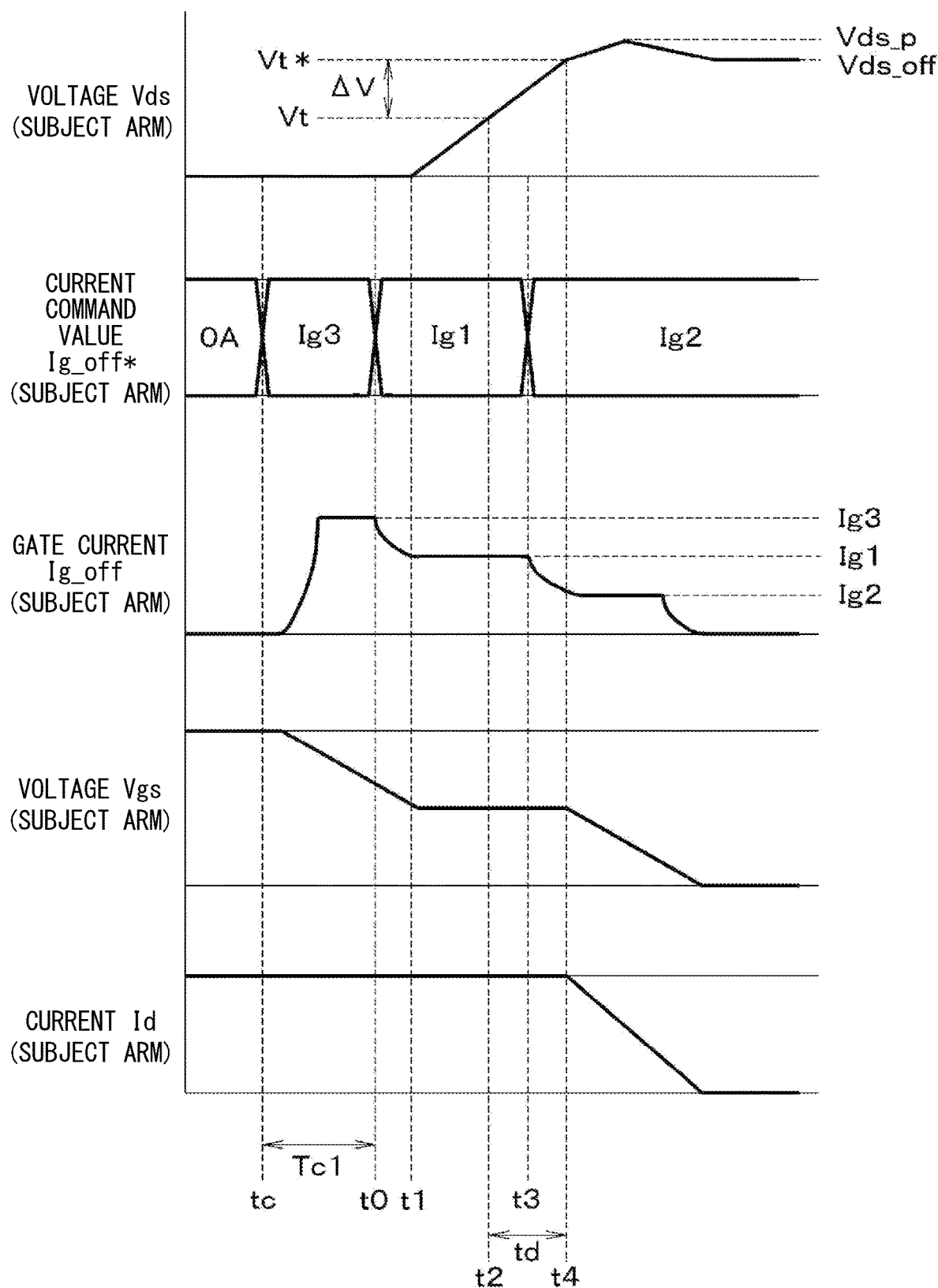
FIG. 17 is a timing chart schematically depicting an operation waveform of each section of a gate drive device at time of turn-off of a semiconductor switching element according to a fifth embodiment.

A fifth embodiment is explained below with reference to FIG. 17. Whereas the gate current Ig_off is switched only once, that is, the gate drive speed is changed only once in each embodiment described above, it is also possible to change the gate drive speed twice or more. In the configuration in the present embodiment, the gate drive speed is changed by switching the gate current Ig_off also before the switching timing in each embodiment described above.

That is, in the present embodiment, the speed change circuit 15 is configured to set the gate drive speed of the semiconductor switching element 5 to a third drive speed which is higher than the first drive speed, and the second drive speed at time of the switching start when switching of the subject-arm semiconductor switching element 5 is started, and thereafter switch the gate drive speed of the semiconductor switching element 5 to the first drive speed when the preset first switching time has passed. In this case, the speed change circuit 15 sets the gate current Ig_off to a third current value Ig3 corresponding to the third drive speed at time of the switching start. The third current value Ig3 is set to a value greater than both the first current value Ig1, and the second current value Ig2.

Next, an operation timing of each section of the gate drive device 1 at time of turn-off of the semiconductor switching element 5 is explained with reference to FIG. 17. Note that all of the voltage Vds, the current command value Ig_off*, the gate current Ig_off, the voltage Vgs, and the current Id in FIG. 17 are those of the subject-arm semiconductor switching element 5. In this case, time point tc is a switching start timing at which switching of the subject-arm semiconductor switching element 5 is started. Before time point tc, the current command value Ig_off* has a value representing 0 A, and thereby the gate current Ig_off is 0 A.

At time point tc, the current command value Ig_off* becomes the third current value Ig3. Thereby, after the passage of predetermined delay time from time point tc, the gate current Ig_off increases from 0 A to the third current value Ig3, and also the voltage Vgs lowers from a voltage value at time of turn-on to a voltage value at time of turn-off. Thereafter, at time point t0 after the passage of first switching time Tc1 from time point tc, the current command value Ig_off* becomes the first current value Ig1. Operation at and after time point t0 is similar to the operation according to the first embodiment depicted in FIG. 2. Note that the first switching time Tc1 is set to such time that the voltage Vds of the subject-arm semiconductor switching element 5 surely does not change during a period from time point tc to time point t0.

According to the present embodiment explained above, advantages like the ones mentioned below are attained. In the present embodiment, the speed change circuit 15 is configured to set the gate drive speed of the semiconductor switching element 5 to the third drive speed which is higher than the first drive speed, and the second drive speed at time of the switching start, and thereafter switch the gate drive speed to the first drive speed when the preset first switching time Tc1 has passed.

At the semiconductor switching element 5, predetermined time is required for the voltage Vds to start actually changing after the gate current starts flowing. The predetermined time can be reduced as the gate drive speed, that is, the gate current, is increased. According to the present embodiment, the gate current Ig_off having the largest third current value Ig3 flows during a period from the switching starting time point tc to time point t0, that is, immediately after the switching start, and so the predetermined time described above can be reduced. Accordingly, according to the present embodiment, it is possible to attain an advantage that dead time can be reduced by an amount corresponding to a reduction of time that passes until the voltage Vds starts actually changing after the switching starting time point.

Sixth Embodiment

Figure 18:
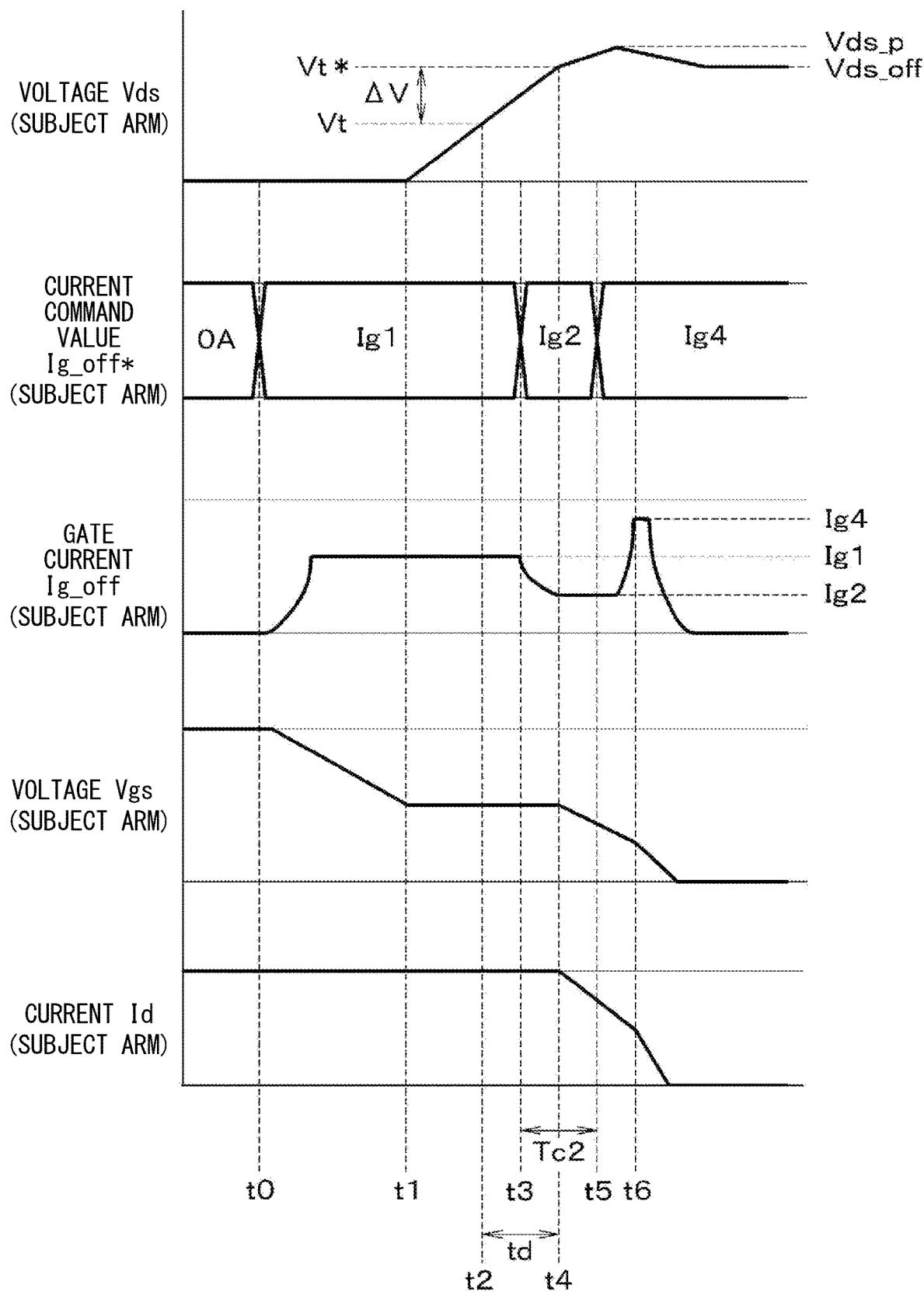
FIG. 18 is a timing chart schematically depicting an operation waveform of each section of a gate drive device at time of turn-off of a semiconductor switching element according to a sixth embodiment.

A sixth embodiment is explained below with reference to FIG. 18. In the configuration in the present embodiment, the gate drive speed is changed by switching the gate current Ig_off also after the switching timing in each embodiment described above. That is, in the present embodiment, the speed change circuit 15 is configured to switch the gate drive speed of the semiconductor switching element 5 to a fourth drive speed which is higher than the second drive speed when preset second switching time has passed from a time point at which the gate drive speed of the semiconductor switching element 5 has been changed from the first drive speed to the second drive speed.

In this case, when the second switching time has passed from the time point at which the gate drive speed has been changed from the first drive speed to the second drive speed, the speed change circuit 15 sets the gate current Ig_off to a fourth current value Ig4 corresponding to the fourth drive speed. The fourth current value Ig4 is set to a value greater than the second current value Ig2.

Next, an operation timing of each section of the gate drive device 1 at time of turn-off of the semiconductor switching element 5 is explained with reference to FIG. 18. Note that all of the voltage Vds, the current command value Ig_off*, the gate current Ig_off, the voltage Vgs, and the current Id in FIG. 18 are those of the subject-arm semiconductor switching element 5. Operation before and at time point t4 is similar to the operation according to the first embodiment depicted in FIG. 2. After time point t4, at time point t5 after the passage of second switching time Tc2 from time point t3, the current command value Ig_off* becomes the fourth current value Ig4. Thereby, after the passage of predetermined delay time from time point t5, the gate current Ig_off increases from the second current value Ig2 to the fourth current value Ig4.

Thereafter, at time point t6 after the passage of predetermined delay time that occurs accompanying operation of the gate drive circuit 11 from time point t5, the actual gate current Ig_off becomes the fourth current value Ig4, and second switching of the gate current Ig_off is completed. In this case, the surge voltage has become the peak at a time point before time point t6; in other words, in this case, the second switching of the gate current Ig_off is performed after the surge voltage has reached the peak. Note that the second switching time Tc2 is set to such time that the surge voltage becomes lower than the tolerance. During a period from time point t6, the current Id lowers to 0 A at a steep inclination, that is, at a large change rate dI/dt, than during a period from time point t4 to time point t6.

According to the present embodiment explained above, advantages like the ones mentioned below are attained. In the present embodiment, the speed change circuit 15 is configured to switch the gate drive speed of the semiconductor switching element 5 to the fourth drive speed which is higher than the second drive speed when the preset second switching time has passed from a time point at which the gate drive speed has been changed from the first drive speed to the second drive speed. After the surge voltage has reached the peak, the surge voltage does not increase further even if the gate current Ig_off is increased.

According to the present embodiment, the gate current Ig_off is switched from the second current value Ig2 to the fourth current value Ig4 which is greater than the second current value Ig2 after the surge voltage has reached the peak, and switching which is faster as compared with the first embodiment is performed. Accordingly, according to the present embodiment, it is possible to attain an advantage that the switching loss at time of turn-off is reduced further. In addition, according to the present embodiment, it becomes possible to more quickly make the current Id 0 A, and so it is possible to attain an advantage that time required for the switching can be reduced.

Seventh Embodiment

Figure 19:
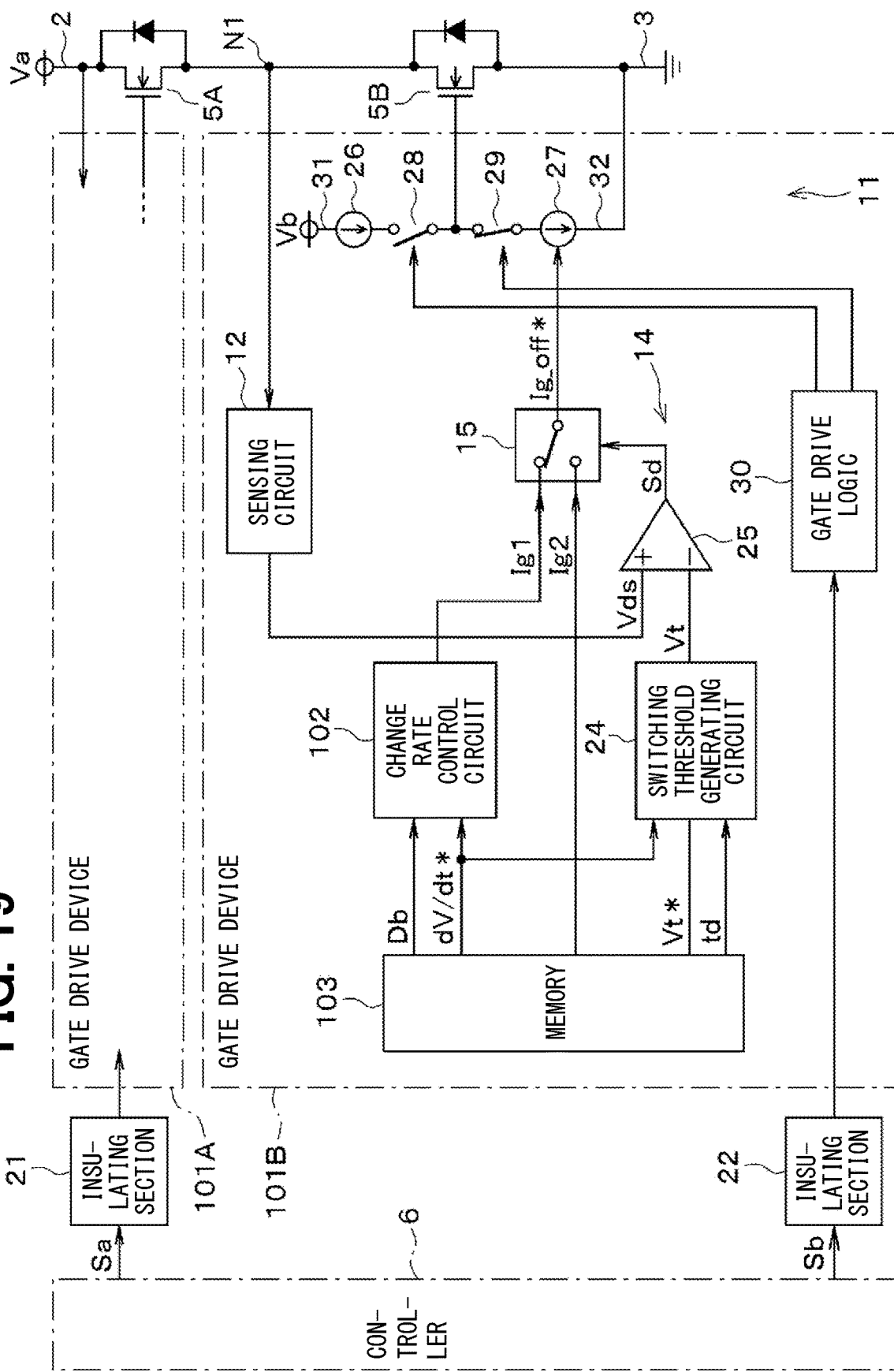
FIG. 19 is a figure depicting an example of the specific configuration of a gate drive device according to a seventh embodiment.

A seventh embodiment is explained below with reference to FIG. 19. As depicted in FIG. 19, a gate drive device 101 according to the present embodiment is different from the gate drive device 1 according to the first embodiment depicted in FIG. 4 in that the gate drive device 101 includes a change rate control circuit 102, and a memory 103 instead of the change rate control circuit 13, and the memory 23, and so on. The gate current of the semiconductor switching element 5 is correlated with the change rate of the voltage Vds. Paying attention to such a fact, the change rate control circuit 102 is configured to compute the first current value Ig1 corresponding to the first drive speed in the manner below.

That is, the change rate control circuit 102 is configured to compute the first current value Ig1 corresponding to the first drive speed on the basis of the target change rate dV/dt*, and relationship information that is acquired in advance, and represents a relationship between the change rate dV/dt of the voltage Vds and the gate current Ig_off corresponding to the gate drive speed. The relationship information described above is map data in which the first current value Ig1 to be output in response to an input target change rate dV/dt* is defined, mathematical formula data representing a relationship between the target change rate dV/dt* and the first current value Ig1, and the like. The memory 103 has stored therein data db representing the relationship information described above, in addition to each value stored on the memory 23. The data db can be acquired in advance by performing various types of simulation, and so on, for example.

In this case, the sensing circuit 12 is configured not to output the signal dV/dt, but, instead of this, the change rate control circuit 102 is configured to receive, as input, the data db output from the memory 103. On the basis of the signal dV/dt*, and the data db, the change rate control circuit 102 computes and outputs the first current value Ig1 corresponding to the first drive speed. Specifically, with reference to the relationship information represented by the data db, the change rate control circuit 102 determines the first current value Ig1 corresponding to the target change rate dV/dt* represented by the signal dV/dt*, and outputs a signal representing the value According to the present embodiment explained above also, the change rate control circuit 102 can determine such a first current value Ig1 corresponding to the first drive speed that the change rate dV/dt of the voltage Vds at time of turn-off is made equal to the target value dV/dt*, and so advantages similar to the advantages of the first embodiment can be attained. In addition, according to the present embodiment, the change rate control circuit 102 only has to be configured to be able to execute relatively simple processes like a determination of the first current value Ig1 with reference to the data db, and so the circuit scale can be kept small as compared to the change rate control circuits 13, and 73 that are required to perform computations by using the change rate dV/dt, and the target change rate dV/dt*.

Eighth Embodiment

Figure 20:
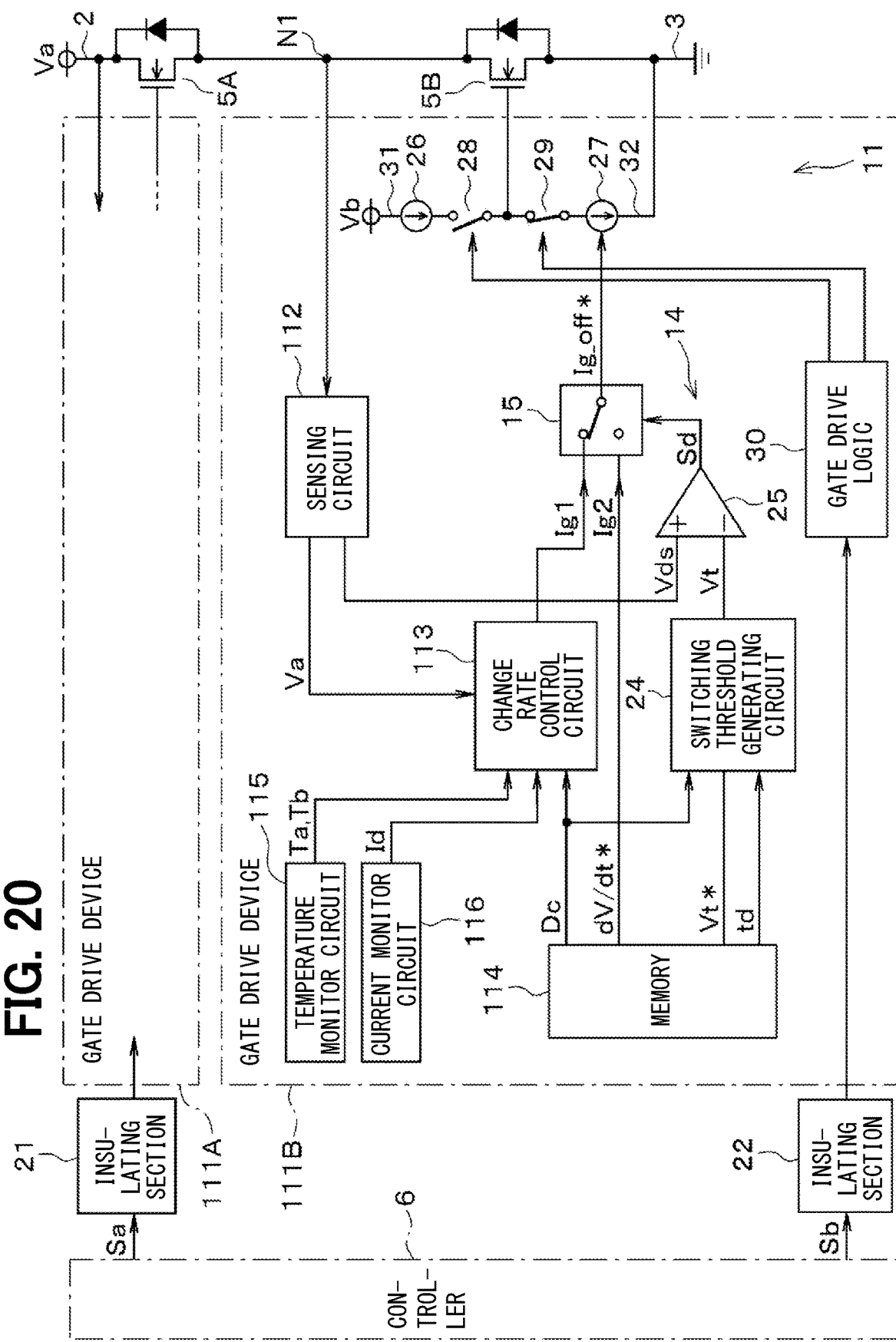
FIG. 20 is a figure depicting an example of the specific configuration of a gate drive device according to an eighth embodiment.

An eighth embodiment is explained below with reference to FIG. 20. As depicted in FIG. 20, a gate drive device 111 according to the present embodiment is different from the gate drive device 101 according to the seventh embodiment depicted in FIG. 19 in that the gate drive device 111 includes a sensing circuit 112, a change rate control circuit 113, and a memory 114 instead of the sensing circuit 12, the change rate control circuit 102, and the memory 103, that a temperature monitor circuit 115, and a current monitor circuit 116 are added, and so on.

The gate current of the semiconductor switching element 5 is correlated not only with the change rate of the voltage Vds, but also with the temperature Ta of the semiconductor switching element 5, the temperature Tb of the gate drive device 111, the power supply voltage Va supplied to the half bridge circuit 4, the current Id of the semiconductor switching element 5, and the like. Paying attention to such a fact, the change rate control circuit 113 is configured to compute the first current value Ig1 corresponding to the first drive speed in the manner below.

That is, in this case, the relationship information is provided for each temperature Ta, each temperature Tb, each power supply voltage Va, and/or each current Id. The change rate control circuit 113 acquires the value of at least one of the temperature Ta, the temperature Tb, the power supply voltage Va, and the current Id, and, in accordance with the acquired value, selects relationship information used for computing the first current value Ig1 corresponding to the first drive speed. Then, the change rate control circuit 113 is configured to compute the first current value Ig1 corresponding to the first drive speed on the basis of the target change rate dV/dt*, and the selected relationship information.

The memory 114 has stored thereon data Dc representing relationship information provided for each temperature Ta, each temperature Tb, each power supply voltage Va, and each current Id. The data Dc can be acquired in advance by performing various types of simulation, and so on, for example. By monitoring the voltage-Vds waveform, the sensing circuit 112 senses the value of the OFF voltage Vds_off generated when the semiconductor switching element 5 is turned off, and estimates the value of the power supply voltage Va from the sensed value. The sensing circuit 112 outputs a signal representing the value of the power supply voltage Va.

The temperature monitor circuit 115 senses the temperature Ta of the semiconductor switching element 5, and the temperature Tb of the gate drive device 111 via temperature sensors or the like, and outputs a signal representing the value of each of the sensed temperature Ta, and the temperature Tb. The current monitor circuit 116 senses the current Id of the semiconductor switching element 5 via an electric-current sensor or the like, and outputs a signal representing the value of the sensed current Id.

The change rate control circuit 113 receives, as input, the signal Va output from the sensing circuit 112, the signal dV/dt*, and data Dc output from the memory 114, the signals Ta, and Tb output from the temperature monitor circuit 115, and Id output from the current monitor circuit 116. On the basis of the input signals, and the like, the change rate control circuit 113 selects optimum relationship information according to the value of the power supply voltage Va, the value of the temperature Ta, the value of the temperature Tb, and the value of the current Id. Then, with reference to the selected relationship information, the change rate control circuit 113 determines the first current value Ig1 corresponding to the target change rate dV/dt* represented by the signal dV/dt*, and outputs a signal representing the value.

According to the present embodiment explained above, advantages similar to the advantages of the seventh embodiment can be attained, and also advantages like the ones mentioned below can be attained. That is, there is a possibility that a relationship between the actual gate current and the change rate of the voltage Vds changes depending on the temperature Ta of the semiconductor switching element 5, the temperature Tb of the gate drive device 71, the temperature of the power supply voltage Va, the current Id, and the like. If the relationship between the actual gate current and the voltage Vds becomes significantly different from a relationship represented by relationship information acquired in advance, there is a risk that the precision of a computation of the first current value Ig1 lowers, the precision of control of the change rate dV/dt lowers.

In view of this, in the present embodiment, relationship information is provided for each temperature Ta, each temperature Tb, each power supply voltage Va, and each current Id, and the change rate control circuit 113 acquires the values of the temperature Ta, the temperature Tb, the power supply voltage Va, and the current Id, and, in accordance with the acquired values, selects relationship information to be used for computing the first current value Ig1 corresponding to the first drive speed. Then, the change rate control circuit 113 is configured to compute the first current value Ig1 corresponding to the first drive speed on the basis of the target change rate dV/dt*, and the selected relationship information. By adopting this configuration, the deterioration of the precision of a computation of the first current value Ig1 due to the temperature Ta, the temperature Tb, the power supply voltage Va, the current Id, and the like is suppressed; as a result, the precision of control of the change rate dV/dt can be maintained favorably.

Other Embodiments

Note that the present disclosure is not limited to each embodiment described above, and additionally described in the figures, but can be modified, combined or expanded as desired within the scope not deviating from the gist of the present disclosure. Numerical values, and the like that are depicted in each embodiment described above are illustrated as examples, and are not the sole examples.

The gate drive device in each embodiment described above can treat, as a drive subject, not only an N-channel MOSFET, but also various types of semiconductor switching element such as a P-channel MOSFET or an IGBT.

Figure 21:
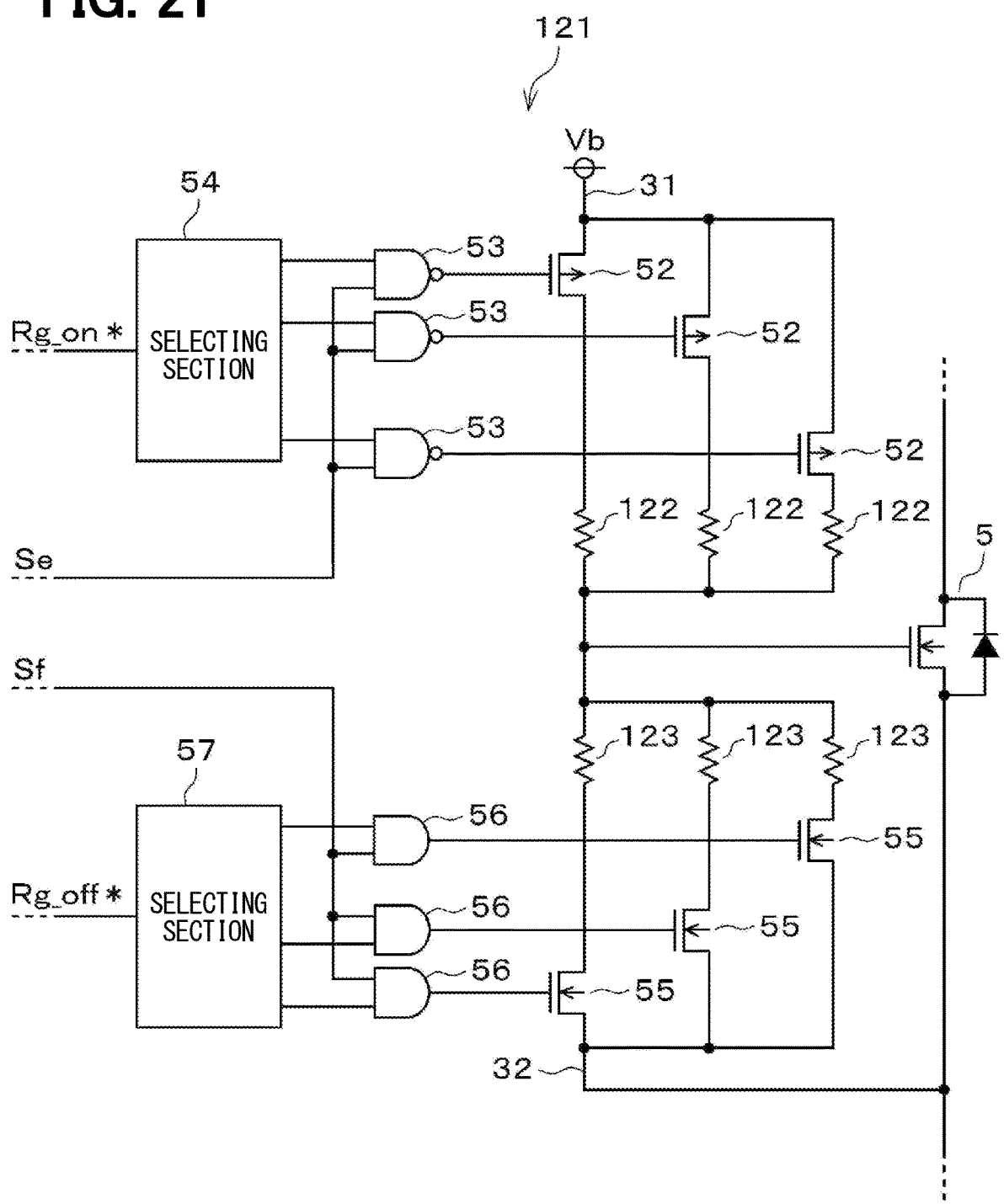
FIG. 21 is a figure depicting a first modification example of a gate drive circuit.

The gate drive speed of the semiconductor switching element 5 may be changed not only by switching of the gate current explained in the first embodiment, and the second embodiment, but may be performed by switching of the gate resistor, by switching of the power supply voltage for driving, and so on. In a case that a modification is made such that the gate drive speed is changed by switching of the gate resistor, a gate drive circuit 121 according to a first modification example depicted in FIG. 21 can be used instead of the gate drive circuits 11, and 42.

The gate drive circuit 121 is different from the gate drive circuit 51 depicted in FIG. 9 in that three gate resistors 122 on the turn-on side, and three gate resistors 123 on the turn-off side are added, and so on. In this case, each drain of the transistors 52 is connected to the gate of the semiconductor switching element 5 via the gate resistor 122. In addition, in this case, each drain of the transistors 55 is connected to the gate of the semiconductor switching element 5 via the gate resistor 123.

In this case, on the basis of a signal representing a resistance command value Rg_on* which is a command for the resistance value of a gate resistor Rg_on on the turn-on side, the selecting section 54 selects a transistor 52 in the three transistors 52 to be turned on, and outputs a signal for turning on the selected transistor 52. According to the configuration described above, when the transistor 52 is turned on, the gate resistor 122 connected in series with the transistor 52 is activated. Accordingly, according to the configuration described above, the resistance value of the gate resistor Rg_on on the turn-on side can be set as desired by adjusting a transistor 52 to be turned on. In addition, according to the configuration described above, it is also possible to adjust the number of transistors 52 to be turned on, and, by doing so, the resistance value of the gate resistor Rg_on can be set more finely.

In addition, in this case, on the basis of a signal representing a resistance command value Rg_off* which is a command for the resistance value of a gate resistor Rg_off on the turn-off side, the selecting section 57 selects a transistor 55 in the three transistors 55 to be turned on, and outputs a signal for turning on the selected transistor 55. According to the configuration described above, when the transistor 55 is turned on, the gate resistor 123 connected in series with the transistor 55 is activated. Accordingly, according to the configuration described above, the resistance value of the gate resistor Rg_off on the turn-off side can be set as desired by adjusting a transistor 55 to be turned on. In addition, according to the configuration described above, it is also possible to adjust the number of transistors 55 to be turned on, and, by doing so, the resistance value of the gate resistor Rg_off can be set more finely.

Figure 22:
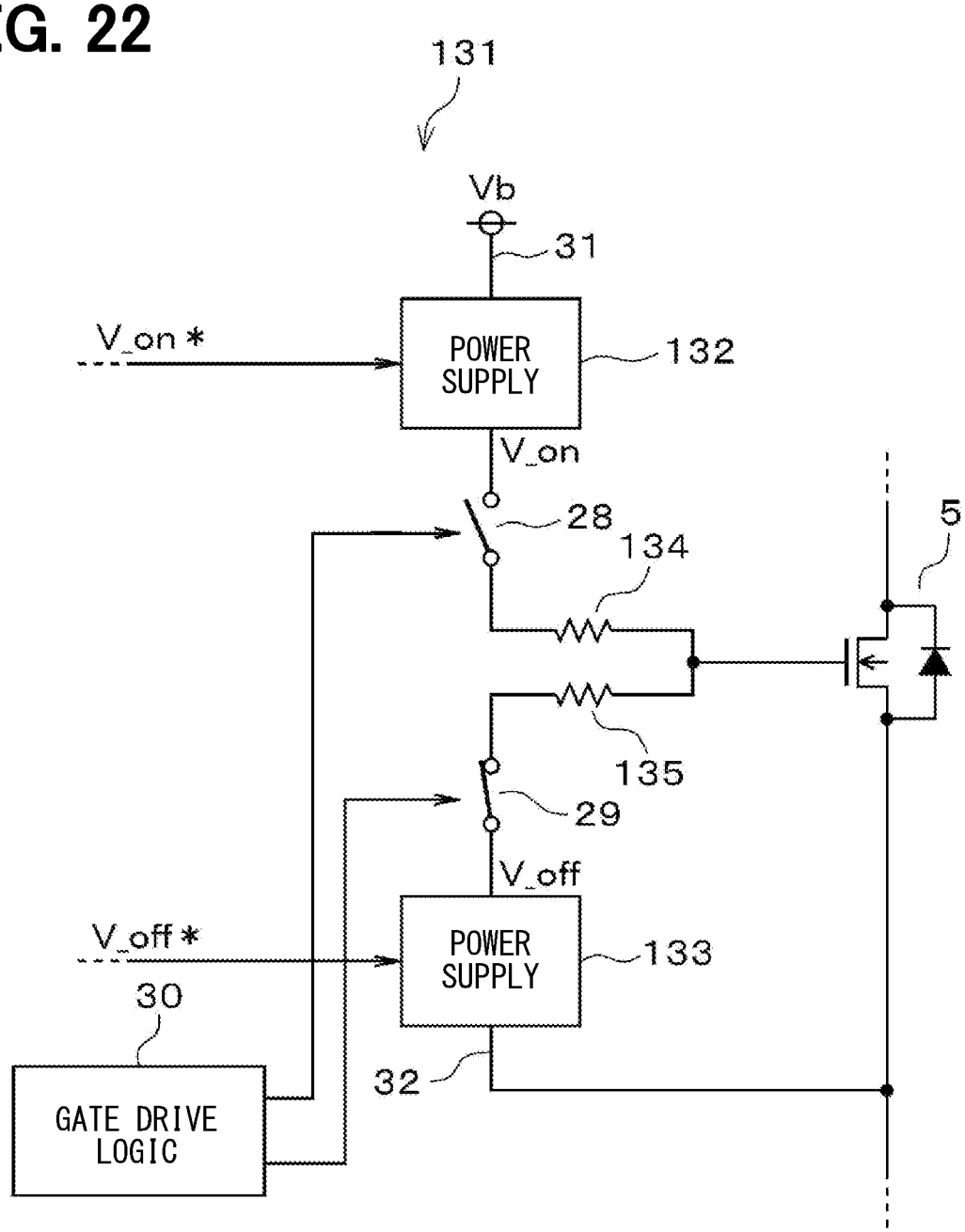
FIG. 22 is a figure No. 1 depicting a second modification example of a gate drive circuit.
Figure 23:
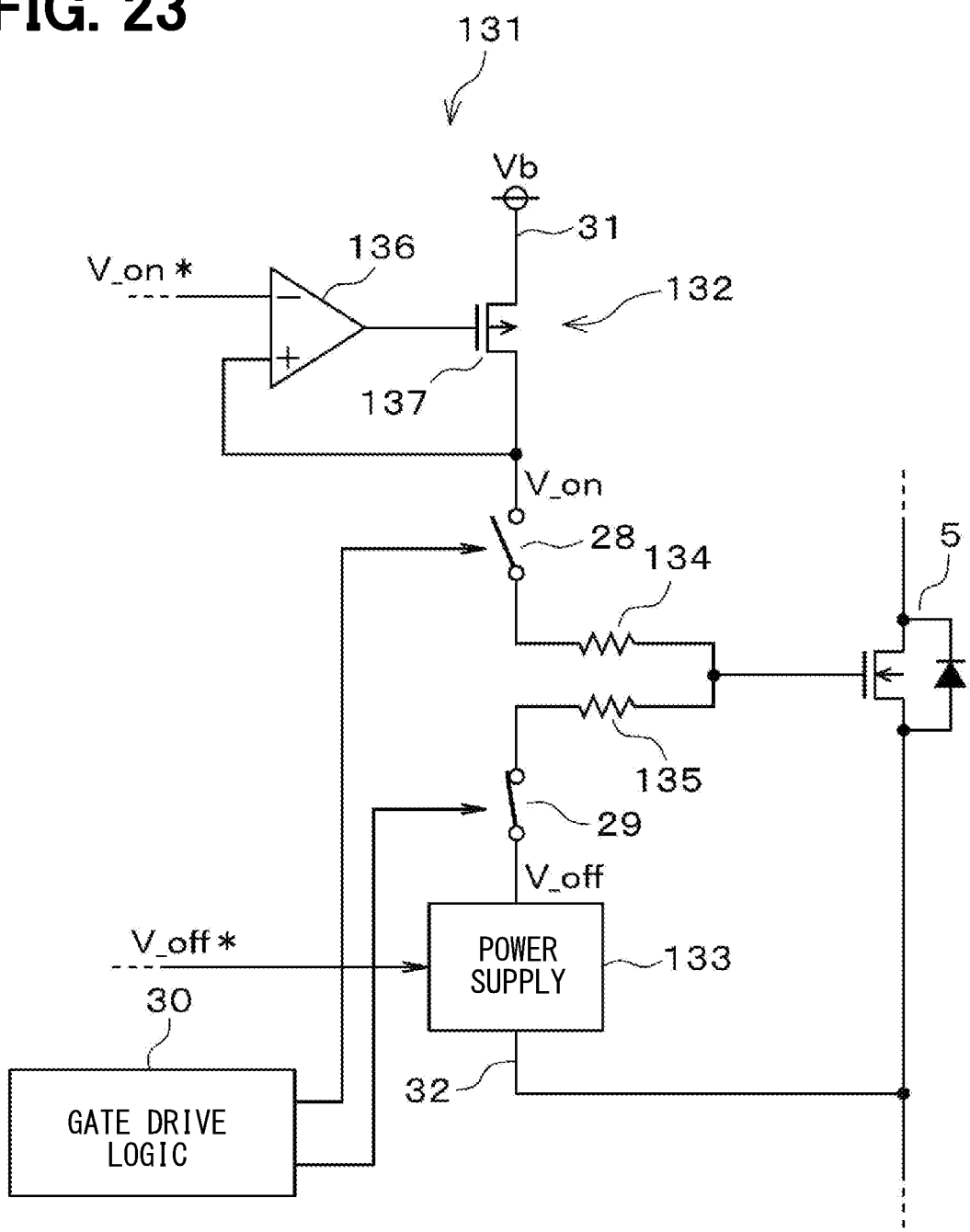
FIG. 23 is a figure No. 2 depicting a second modification example of a gate drive circuit.

In a case that a modification is made such that the gate drive speed is changed by switching of the power supply voltage for driving, a gate drive circuit 131 according to a second modification example depicted in FIG. 22, and FIG. 23 can be used instead of the gate drive circuits 11, and 42. The gate drive circuit 131 is different from the gate drive circuits 11, and 42 depicted in FIG. 4, FIG. 7, and the like in that the gate drive circuit 131 includes power supplies 132, and 133 instead of the current sources 26, and 27, that gate resistors 134, and 135 are added, and so on.

The power supply 132 is connected between the power supply line 31 and the switch 28, and outputs a positive power supply voltage V_on that turns on the gate of the semiconductor switching element 5. The gate resistor 134 is connected between the switch 28 and the gate of the semiconductor switching element 5. The power supply voltage V_on output from the power supply 132 is applied to the gate of the semiconductor switching element 5 via the switch 28, and the gate resistor 134. The power supply 132 is configured to be able to change the voltage value of the power supply voltage V_on on the basis of a signal representing a voltage command value V_on* which is a command for the voltage value.

In this manner, as depicted in FIG. 23, a configuration that uses an OP amplifier 136, and a transistor 137 which is a P-channel MOS transistor can be adopted as a specific configuration example that realizes the power supply 132 that can change the voltage value of the power supply voltage V_on. The source of the transistor 137 is connected to the power supply line 31, the drain of the transistor 137 is connected to the gate of the semiconductor switching element 5 via the switch 28, and the gate resistor 134.

The inverted input terminal of the OP amplifier 136 receives a signal V_on* as input. The non-inverted input terminal of the OP amplifier 136 is connected to the drain of the transistor 137. An output signal of the OP amplifier 136 is input to the gate of the transistor 137. According to such a configuration, the power supply voltage V_on can be controlled precisely by changing the gate voltage of the transistor 137 by using the OP amplifier 136.

The power supply 133 is connected between the power supply line 32 and the switch 29, and outputs a negative power supply voltage V_off that turns off the gate of the semiconductor switching element 5. The gate resistor 135 is connected between the switch 29 and the gate of the semiconductor switching element 5. The power supply voltage V_off output from the power supply 133 is applied to the gate of the semiconductor switching element 5 via the switch 29, and the gate resistor 135. The power supply 133 is configured to be able to change the voltage value of the power supply voltage V_off on the basis of a signal representing a voltage command value V_off* which is a command for the voltage value.

Whereas the present disclosure has been described in accordance with implementation examples, it is understood that the present disclosure is not limited to the implementation examples or structures. The present disclosure incorporates even various modification examples, and modifications within the equivalent scope. Additionally, various combinations, and forms, and furthermore other combinations, and forms additionally including only one element or more, or fewer elements are covered by the scope of the present disclosure, and the scope of idea.

The controllers and methods described in the present disclosure may be implemented by a special purpose computer created by configuring a processor programmed to execute one or more particular functions embodied in computer programs. Alternatively, the apparatuses and methods described in the present disclosure may be implemented by special purpose hardware logic circuits. Further alternatively, the apparatuses and methods described in the present disclosure may be implemented by a combination of one or more special purpose computers created by configuring a processor executing computer programs and one or more hardware logic circuits. The computer programs may be stored, as instructions being executed by a computer, in a tangible non-transitory computer-readable medium.

What is claimed is:

1. A gate drive device comprising:
a gate drive circuit configured to drive a gate of a drive-subject element, which is one of two semiconductor switching elements included in an upper and lower arm of a half bridge circuit;
a sensing circuit configured to
acquire a physical quantity related to the drive-subject element and
sense an element voltage, which is a voltage between main terminals of the drive-subject element, on a basis of the physical quantity;

a change rate control circuit configured to compute, on a basis of a sensing value of the sensing circuit and a target change rate which is a target value of a change rate of the element voltage during a change period in which the element voltage changes, a first drive speed which is a gate drive speed of the drive-subject element for controlling the change rate of the element voltage during the change period, such that the change rate becomes the target change rate;

a timing generating circuit configured to
   acquire, in advance, a delay time caused in each circuit when the gate of the drive-subject element is driven,
   determine, on a basis of the target change rate and the delay time, a switching timing, at which the element voltage reaches a switching threshold voltage which is lower than a desired switching voltage by a predetermined value, during turn-off of the drive-subject element, and
   generate a timing signal representing the switching timing; and a speed change circuit configured to change the gate drive speed of the drive-subject element from the first drive speed to a second drive speed, which is different from the first drive speed, at the switching timing represented by the timing signal during turn-off of the drive-subject element.

2. A gate drive device comprising:

a gate drive circuit configured to drive a gate of a drive-subject element, which is one of two semiconductor switching elements included in an upper and lower arm of a half bridge circuit;

a sensing circuit configured to
   acquire a physical quantity related to a non-drive-subject element which is the other one of the two semiconductor switching elements and
   sense an element voltage, which is a voltage between main terminals of the non-drive-subject element, on a basis of the physical quantity;

a change rate control circuit configured to compute, on a basis of a sensing value of the sensing circuit and a target change rate which is a target value of a change rate of the element voltage during a change period in which the element voltage changes, a first drive speed which is a gate drive speed of the drive-subject element for controlling the change rate of the element voltage during the change period such that the change rate becomes the target change rate;

a timing generating circuit configured to
   acquire, in advance, a delay time caused in each circuit when the gate of the drive-subject element is driven,
   determine, on a basis of the target change rate and the delay time, a switching timing at which the element voltage reaches a switching threshold voltage which is lower than a desired switching voltage by a predetermined value, during turn-on of the drive-subject element, and
   generate a timing signal representing the switching timing; and a speed change circuit configured to change the gate drive speed of the drive-subject element from the first drive speed to a second drive speed, which is different from the first drive speed, at the switching timing represented by the timing signal during turn-on of the drive-subject element.

3. The gate drive device according to claim 1, wherein
the switching voltage is Vt*,
the delay time is td,
the target change rate is dV/dt*,
the switching threshold voltage is Vt, and
the timing generating circuit is configured to determine, as the switching timing, a timing at which the switching threshold voltage satisfies a following formula: $Vt = Vt^* - dV/dt^* \times td$.

4. The gate drive device according to claim 1, further comprising:

a voltage acquiring circuit configured to acquire a value of a power supply voltage supplied to the half bridge circuit, wherein the timing generating circuit is configured to
   acquire, in advance, values of the delay time respectively corresponding to values of the power supply voltage, which are different from each other, and
   determine the switching timing on a basis of the delay time according to the power supply voltage acquired by the voltage acquiring circuit.

5. The gate drive device according to claim 1, further comprising:

a temperature acquiring circuit configured to acquire a value of at least one of a temperature of the semiconductor switching element or a temperature of the gate drive device, wherein the timing generating circuit is configured to
   acquire, in advance, values of the delay time respectively corresponding to values of the temperature, which are different from each other, and
   determine the switching timing on a basis of the delay time according to a value of the temperature acquired by the temperature acquiring circuit.

6. The gate drive device according to claim 1, wherein
the timing generating circuit is configured to adjust the switching timing on a basis of the first drive speed, the second drive speed, and the sensing value of the sensing circuit.

7. The gate drive device according to claim 1, wherein
the sensing circuit includes a voltage dividing circuit configured to divide the voltage between the main terminals of the drive-subject element by capacities, and
the sensing circuit is configured to sense the element voltage on a basis of an output voltage of the voltage dividing circuit.

8. The gate drive device according to claim 1, wherein
the gate drive circuit includes an output stage including a plurality of transistors which are connected in parallel, and
the speed change circuit is configured to change the gate drive speed by adjusting a number of transistors to be turned on.

9. The gate drive device according to claim 1, wherein
the gate drive circuit includes
   a current sensing section configured to sense a gate current which is a current to flow to the gate of the drive-subject element and
   a transistor of an output stage in which a drive state is to be controlled such that a sensing value of the current sensing section becomes equal to a command value of the gate current, and
the speed change circuit is configured to change the gate drive speed by adjusting the command value of the gate current.

10. The gate drive device according to claim 1, wherein
the change rate control circuit is configured to compute the first drive speed such that a difference between the target change rate and the change rate of the element voltage obtained from the sensing value of the sensing circuit becomes zero.

11. The gate drive device according to claim 1, wherein the change rate control circuit is configured to compute the first drive speed on a basis of the target change rate and relationship information, which is acquired in advance and represents a relationship between the change rate of the element voltage and the gate drive speed.

12. The gate drive device according to claim 11, wherein the relationship information is provided for
   each value of a temperature of the drive-subject element,
   each value of a temperature of the gate drive device,
   each value of a power supply voltage supplied to the half bridge circuit, and/or
   each value of an element current which is a current to flow between the main terminals of the drive-subject element, and
the change rate control circuit is configured to
   acquire a value of at least one of the temperature of the drive-subject element, the temperature of the gate drive device, the power supply voltage, or the element current, and
   select, in accordance with the value which is acquired, the relationship information to be used for computing the first drive speed.

13. The gate drive device according to claim 1, further comprising:
   a peak value control circuit configured to compute the second drive speed which is the gate drive speed of the drive-subject element for controlling a peak value of the element voltage during the change period, such that the peak value becomes a target peak value which is a target value of the peak value of the element voltage during the change period, on a basis of the sensing value of the sensing circuit and the target peak value.

14. The gate drive device according to claim 1, wherein the change rate control circuit is configured to output a change permission signal in response to a difference between the change rate and the target change rate that is stabilized at a value smaller than a preset error tolerance, and
the speed change circuit is configured to change the gate drive speed only during a period in which the change permission signal is being output from the change rate control circuit.

15. The gate drive device according to claim 14, wherein the change rate control circuit is configured to
   set the target change rate to a value, which is smaller than an original value, immediately after a start of operation of the gate drive device and immediately after an output state, in which the change permission signal is output, is switched to a stopped state, in which output of the change permission signal is stopped,
   thereafter start increasing the target change rate to the original value under a condition where a peak value of the element voltage during the change period is equal to or smaller than a preset tolerance, and
   output the change permission signal in response to the difference between the change rate and the target change rate that is stabilized at a value smaller than the error tolerance, in a state where the target change rate becomes the original value.

16. The gate drive device according to claim 1, wherein the speed change circuit is configured to
   set the gate drive speed of the drive-subject element to a third drive speed, which is higher than the first drive speed and the second drive speed, at a time of a switching start when switching of the drive-subject element is started, and
   thereafter switch the gate drive speed of the drive-subject element to the first drive speed when a preset first switching time has passed.

17. The gate drive device according to claim 1, wherein the speed change circuit is configured to switch the gate drive speed of the drive-subject element to a fourth drive speed, which is higher than the second drive speed, when a preset second switching time has passed from a time point at which the gate drive speed of the drive-subject element is changed from the first drive speed to the second drive speed.

* * * * *